United States Patent
Umeno et al.

(10) Patent No.: US 7,411,997 B2
(45) Date of Patent: Aug. 12, 2008

(54) APPARATUS AND METHOD FOR FILTERING A SPECTRUM SPREAD COMMUNICATION

(75) Inventors: Ken Umeno, Tokyo (JP); Shenghung Shih, Tokyo (JP); Akihiro Yamaguchi, 2-16-202, Mitoma 2-chome, Higashi-ku, Fukuoka-shi, Fukuoka 811-0201 (JP)

(73) Assignees: Japan Science and Technology Corporation, Saitama (JP); Chaosware Inc., Tokyo (JP); Akihiro Yamaguchi, Fukuoka (JP)

( * ) Notice: Subject to any disclaimer, the term of this patent is extended or adjusted under 35 U.S.C. 154(b) by 391 days.

(21) Appl. No.: 10/473,310

(22) PCT Filed: Mar. 26, 2002

(86) PCT No.: PCT/JP02/02902

§ 371 (c)(1),
(2), (4) Date: Mar. 1, 2004

(87) PCT Pub. No.: WO02/078183

PCT Pub. Date: Oct. 3, 2002

(65) Prior Publication Data

US 2004/0146095 A1 Jul. 29, 2004

(30) Foreign Application Priority Data

Mar. 26, 2001 (JP) .............................. 2001-087480
Oct. 2, 2001 (JP) .............................. 2001-306794
Feb. 21, 2002 (JP) .............................. 2002-045255

(51) Int. Cl.
*H04B 1/707* (2006.01)

(52) U.S. Cl. ........................ 375/150; 375/136; 375/142; 375/147

(58) Field of Classification Search ................. 375/130, 375/134, 136, 142, 143, 147, 149, 150, 152, 375/343; 370/209, 441; 708/314, 422, 426, 708/425

See application file for complete search history.

(56) References Cited

U.S. PATENT DOCUMENTS 5,311,457 A * 5/1994 Shizawa ..................... 708/316

(Continued)

FOREIGN PATENT DOCUMENTS

JP           06-177853           6/1994

(Continued)

OTHER PUBLICATIONS

Chi-Chung Chen, Ezio Biglieri, Kung Yao "Design of Spread Spectrum Sequences Using Ergodic Theory", UCLA and Politecnico di Torino, ISIT 2000, Sorrento, Italy, Jun. 25-30, 2000.*

(Continued)

*Primary Examiner*—Chieh M. Fan
*Assistant Examiner*—Aristocratis Fotakis
(74) *Attorney, Agent, or Firm*—Luce Forward Hamilton & Scripps LLP; Mitchell P. Brook

(57) ABSTRACT

A filter (201) accepts spreading code sequences or the like as input sequences of a chip rate 1/D, the accepted spreading code sequences are sequentially delayed and distributed by delay circuits (202) connected in series, delay times of individual signals are an arithmetical progression with a chip length D being a common difference D, the individual signals are amplified with spreading codes by amplifiers (203), amplification factors for the individual signals are a geometrical progression of a common ratio r, the sum of the amplified signals is obtained by addition in an adder (204), and the result is sequentially output as an output sequence.

4 Claims, 26 Drawing Sheets

U.S. PATENT DOCUMENTS

| | | | |
|---|---|---|---|
| 6,141,374 A * | 10/2000 | Burns | 375/152 |
| 6,493,329 B1 * | 12/2002 | Leung | 370/335 |
| 6,577,676 B1 * | 6/2003 | Hashimoto | 375/152 |
| 6,661,831 B1 * | 12/2003 | Umeno | 375/142 |
| 6,721,293 B1 * | 4/2004 | Komulainen et al. | 370/335 |
| 7,099,366 B2 * | 8/2006 | Umeno | 375/130 |
| 2007/0098054 A1 * | 5/2007 | Umeno | 375/150 |

FOREIGN PATENT DOCUMENTS

| | | |
|---|---|---|
| JP | 09-244876 | 9/1997 |
| JP | 10-322311 | 12/1998 |
| JP | 2001-060937 | 3/2001 |
| JP | 2001-060937 A | 3/2001 |
| JP | 2001-069079 | 3/2001 |
| JP | 2001-292129 | 10/2001 |
| WO | WO 00/30280 A1 | 5/2000 |
| WO | WO 00/60738 A1 | 10/2000 |

OTHER PUBLICATIONS

Chi-Chung Chen, Kung Yao, Ezio Biglieri "Optimal Spread Spectrum Sequences-Constructed From Gold Codes" UCLA and Politecnico di Torino, 2000 IEEE.*

Chen et al., "Optimal Chaotic Spread Spectrum Sequences for Uplink CDMA Systems", The IEEE Adaptive System for Signal Processing, Communications, and Control Symposium 2000, IEEE, Oct. 1-4, 2000, p. 135-140 (ISBN: 0-7803-5800-7).

Tsuneda Kohda, "Pseudonoise Sequences by Chaotic Nonlinear Maps and Their Correlation Properties", IEICE Transactions on Communications, (Tokyo, Japan) E76-B(8), Aug. 1993, p. 855-862.

* cited by examiner

APPARATUS AND METHOD FOR FILTERING A SPECTRUM SPREAD COMMUNICATION

TECHNICAL FIELD

The present invention relates to a filter apparatus, a receiving apparatus, a transmitting apparatus, a spread modulation apparatus, a pseudorandom sequence output apparatus, a filter method, a receiving method, a transmitting method, a spread modulation method, a pseudorandom sequence output method and a program which realizes them on a computer.

Those subject matters are suitable for realizing a filtering process effective in an asynchronous CDMA (Code Division Multiple Access) of a spectrum spread communication, which can be used in a distance measuring field, as well as, for example, satellite communication, fixed-line communication, portable phone and PHS (Personal Handyphone System), and acquiring a pseudorandom sequence which can be used as spreading codes.

BACKGROUND ART

Conventionally, there have been proposed an M-sequence, Kasami-codes, a Gold sequence or the like which are generated by a linear feedback shift register (LFSR) as spreading codes which realize spectrum spread communication and code division multiplex communication. Those spreading code sequences have the following two features.

First, there is a single peak in the correlation (autocorrelation) between same codes and the correlation (cross-correlation) between different codes is 0. This is extremely analogous to the property of white noise.

Secondly, in case where two different spreading codes included in a set of codes are selected and in case where a code set is constructed in such a way that if either one is selected, the cross-correlation comes closer to 0, the number of codes included in the code set is merely 0(N) with respect to a code length N. Therefore, there are few kinds of codes.

Meanwhile, there have also been known TDMA (Time Division Multiple Access) and FDMA (Frequency Division Multiple Access). Unlike those, the asynchronous CDMA communication system has a feature that decoding is possible by using the correlation characteristics of codes to be used without positively taking synchronism of signals. Therefore, it is excellent in security, confidentiality, anti-interference, disturbance and so forth.

At present, the asynchronous CDMA communication system is undergoing the practical use stage and its use has been decided as the ITU (International Telecommunication Union) standard for wireless communication of the next generation called IMT-2000 (International Mobile Telecommunication 2000).

It is known from the recent studies that in the asynchronous CDMA communication system, the variance $\sigma$ of intersymbol interference noise determines the performance of the system. It is disclosed in, for example, the following document that in case where pseudo white noise, such as a Gold-code or Kasami-code, is used as a spreading code, the variance $\sigma$ is asymptotically $$\sigma = (K-1)/3N$$

where K is the number of simultaneously connected users and N is the code length.

M. B. Pursley, "Performance Evaluation for Phased-Coded Spread-Spectrum Multiple-Access Communication-Part I: System Analysis" (IEEE Trans. Communications, vol. 25 (1977) pp. 795-799.)

Here, "asymptotically" means a case where the user number K and the code length N taken are large.

Conventionally, the theoretical limit of the performance of the asynchronous CDMA communication system was considered to be this $\sigma = (K-1)/3N$. However, it was also known that satisfying such an asymptotical relationship was originated from spreading codes being pseudo white noise.

In case where spreading codes are not pseudo white noise, i.e., in case where there is some correlation between different codes, however, the theoretical limit of the performance may be improved.

Recently has been discovered the existence of spreading codes which have an autocorrelation function such that the variance $\sigma$ of intersymbol interference noise is reduced as compared with $\sigma$ case where spreading codes are pseudo white noise. That is, in case where an autocorrelation function C(s) decreases exponentially as follows with respect to a code shift amount s $$C(s) \approx \text{Const.} \times (-r)^{-s} (0 < r < 1),$$

the variance $\sigma$ of intersymbol interference noise becomes smaller than that in the case of pseudo white noise.

In case where a real impulse constant r satisfies $$r = 2 - 3^{1/2},$$

particularly, it takes the form of the following optimal correlation function $$\sigma_{optimal} = 3^{1/2}(K-1)/(6N).$$

This means that the number of simultaneously connected users, K, at the same bit error rate is increased by 15% from the theoretical limit of the user number of the asynchronous CDMA communication system when pseudo white noise is used as a spreading code. This point is disclosed in the following document.

G. Mazzini, R. Rovatti, and G. Setti "Interference Minimization by Auto-Correlation Shaping in Asynchronous DS-CDMA Systems: Chaos-Based Spreading is Nearly Optimal" (Electron. Lett. (1999) vol. 35, pp. 1054-1055)

The document illustrates that a correlation function C(s) which satisfies the above condition can be approximately typified by constructing chaos-based spreading codes using a piecewise linear map whose partial slope is extremely large.

To actually generate such a spreading sequence using a DSP (Digital Signal Processor) or the like and use in a portable phone or the like, however, high speed and low consumed power are needed, so that the following problems would arise.

First, there was a problem that as spreading codes were composed of a piecewise linear map whose partial slope is extremely large, executing computation by a DSP or computer or the like increased digit drop so that accurate results could not be obtained. This has brought about a matter that it is difficult to generate spreading codes in physical circuits or devices.

Secondly, there was a problem that a parameter which determines the manner of attenuation of a correlation function could not be adjusted freely with respect to an arbitrary r ($-1 < r < 1$).

Thirdly, the aforementioned document shows that there are few types of piecewise linear maps having correlation functions close to the optimal correlation function. To realize a CDMA communication system, however, it is better to provide as many kinds of codes as possible. Therefore, the use of the scheme disclosed in the aforementioned document made it difficult to actually construct a CDMA communication system.

Fourthly, with spreading codes generated by using a linear shift register, the types of codes with a good correlation characteristic with respect to the code length N are merely 0(N). This is very small whereas the proper types of codes should be a number $0(2^N)$ proportional to the power of 2. It is therefore difficult to cope with an increase in the number of users.

Fifthly, as the key space is narrow, there is less work needed for decoding. This raises a problem that the communication security becomes weaker.

The technique disclosed in the aforementioned document has not improvements made on those problems.

Therefore, there is a strong demand for a technique of generating spreading codes composed of a pseudorandom sequence (also called PN (Pseudo Noise) sequence) suitable for an asynchronous CDMA communication system while overcoming those problems.

There has been proposed a wireless communication technique by a system, such as the IMT-2000 W-CDMA system, 1CDMA 2000 system, Wireless LAN IEEE 802.11b or the like. As such wireless communication uses the same frequency band for plural communication connections, CDMA (Code Division Multiple Access) is utilized.

In the CDMA, plural communication connections can be put in the same frequency band or a desired communication connection can be separated from the same frequency band by spread-modulating communication information using different spreading codes.

Meanwhile, in those wireless communications, it is typical to transform information to be transferred into a complex number sequence, then perform a process.

Therefore, there is a demand for a simple technique for performing spread modulation using spreading codes which has an excellent separability in such a wireless communication technology.

Further, there has been proposed a spectrum spreading technique which uses, as spreading codes, an orthogonal code sequence (including an M-sequence, Gold-codes, an orthogonal code sequence acquired from a Walsh function, an orthogonal code sequence acquired from a Chebyshev's polynomial, a Baker sequence and a Manchester-coded orthogonal sequence; the same applied hereinafter).

As the same frequency band is used in plural communication connections in a wireless communication technique using systems, for example, the IMT-2000 W-CDMA system, 1CDMA 2000 system and Wireless LAN IEEE 802.11b, CDMA (Code Division Multiple Access) is used.

In the CDMA, a complex number in which elements of an orthogonal code sequence are placed in a real portion and an imaginary portion is a spreading code and plural communication connections can be put in the same frequency band or a desired communication connection can be separated from the same frequency band by spread-modulating communication information using different spreading codes.

In such a wireless communication technique, communication often takes place between a base station and a mobile terminal, but generally, first, a mobile terminal sends a signal to a base station (Up Link communication) and the base station receives it and takes synchronization, then communication is performed between both.

At the time of starting communication between both, therefore, synchronization is taken by getting a correlation on the then receiver side (which is generally the base station but may be the mobile terminal in some case).

Meanwhile, communication after synchronization (Down Link communication) has only to perform synchronization detection because synchronization has been taken beforehand.

In such a wireless communication technique, there is always a demand for a communication technique which has an excellent separability and has a low BER (Bit Error Rate) even if users are increased.

Further, there are large demands for an apparatus and devices that can perform a filter process which is used in a general-purpose fashion at the time of solving those problems. It is deemed that such a filter process has a wide range of application of to other fields.

The present invention aims at providing a filter apparatus, a receiving apparatus, a transmitting apparatus, a pseudorandom sequence output apparatus, a filter method, a receiving method, a transmitting method and a pseudorandom sequence output method, which are suitable in such various usages, and a program which realizes them on a computer.

DISCLOSURE OF INVENTION

To achieve the object, the following subject matters will be disclosed based on the principle of the invention.

A filter apparatus according to the first aspect of the invention is a filter apparatus for a predetermined real impulse constant r ($-1 < r < 1$), a predetermined real number constant x ($x \neq 0$), a predetermined delay time constant D and a predetermined positive integer M ($M > 1$), has an input terminal, a delay amplification section, an adding section and an output terminal, and is constructed as follows.

That is, the input terminal accepts inputting of an input signal.

Meanwhile, the delay amplification section outputs M signals that are the input-accepted input signal delay-amplified with a delay time $t_0$ and an amplification factor $a_0$, with a delay time $t_1$ and an amplification factor $a_1$, . . . , and with a delay time $t_{M-1}$ and an amplification factor $a_{M-1}$, respectively.

Further, the adding section outputs a sum of the delay-amplified and output M signals.

And, the output terminal outputs the added and output signal.

Meanwhile, $t_0, t_1, \ldots, t_{M-1}$ is an arithmetical progression of a common difference D.

Further, $a_0, a_1, \ldots, a_{M-1}$, is a geometrical progression of a common ratio $-r$ or $-1/r$.

The following are typical combinations of such delay times and amplification factors.

(1) For $t_0=0, t_1=D, \ldots, t_{M-1}=(M-1)D$, $a_0=(-r)^{M-0}=(-r)^M$, $a_1=(-r)^{M-1}=(-r)^{M-1}, \ldots, a_{M-1}=(-r)^{M-(M-1)}=(-r)^1$.

(2) For $t_0=D, t_1=2D, \ldots, t_{M-1}=MD$, $a_0=(-r)^{M-0}=(-r)^M$, $a_1=(-r)^{M-1}=(-r)^{M-1}, \ldots, a_{M-1}=(-r)^{M-(M-1)}=(-r)^1$.

(3) For $t_0=0, t_1=D, \ldots, t_{M-1}=(M-1)D$, $a_0=(-r)^{1+0}=(-r)^1$, $a_1=(-r)^{1+1}=(-r)^2, \ldots, a_{M-1}=(-r)^{1+(M-1)}=(-r)^M$.

(4) For $t_0=D, t_1=2D, \ldots, t_{M-1}=MD$, $a_0=(-r)^{1+0}=(-r)^1$, $a_1=(-r)^{1+1}=(-r)^2, \ldots, a_{M-1}=(-r)^{1+(M-1)}=(-r)^M$.

Further, in the filter apparatus of the invention, the delay amplification section has a delay section and an amplification section and be constructed as follows.

That is, the delay section outputs M signals that are the input-accepted input signal delayed with delay times $t_0, t_1, \ldots, t_{M-1}$, respectively.

Meanwhile, the amplification section outputs M signals that are the delayed and output M signals $s_0, s_1, \ldots, s_{M-1}$ amplified with amplification factors $a_0, a_1, \ldots, a_{M-1}$, respectively.

In the filter apparatus of the invention, the predetermined real impulse constant r can be constructed so as to be equal to $2-3^{1/2}$ in a notation of a fixed point computation with a predetermined accuracy.

In the filter apparatus of the invention, the predetermined real impulse constant r can be constructed so as to satisfy $$2-3^{1/2}-0.1 \leq r \leq 2-3^{1/2}+0.1.$$

A receiving apparatus according to another aspect of the invention has a signal receiving section, a reception-side filter section, a code generating section, a code-side filter section and a correlation detection section and is constructed as follows.

That is, the signal receiving section receives signals.

Meanwhile, the reception-side filter section accepts the received signals as an input sequence and filters and outputs it.

Further, the code generating section generates spreading codes.

Then, the code-side filter section accepts the generated spreading codes as an input sequence and filters and outputs it.

Meanwhile, the correlation detection section performs correlation detection on a result of filtering in the reception-side filter section with respect to a result of filtering in the code-side filter-section to recover the transmitted data signal.

Further, each of the reception-side filter section and the correlation detection section is the above-described filter apparatus with respect to a predetermined real impulse constant r, a predetermined real number constant x, a predetermined delay time constant D and a predetermined positive integer N.

In the receiving apparatus of the invention, the code generating section can be constructed so as to generate, as spreading codes, an orthogonal code sequence (including an M-sequence, Gold-codes, an orthogonal code sequence acquired from a Walsh function, an orthogonal code sequence acquired from a Chebyshev's polynomial, a Baker sequence and a Manchester-coded orthogonal sequence; the same applied hereinafter), or a complex orthogonal code sequence in which a real portion and an imaginary portion are respectively composed of different orthogonal code sequences.

The filter apparatus of the invention can be a complex filter apparatus by constructing the input terminal so as to accept a sequence of complex numbers as an input signal, and constructing the output terminal so as to output a sequence of complex numbers as an output signal.

A complex filter apparatus according to a further aspect of the invention filters a sequence of complex numbers, has a complex input section, a real filter section, an imaginary filter section and a complex output section and is constructed as follows.

That is, the complex input section accepts inputting of a sequence of complex numbers.

Meanwhile, the real filter section filters a sequence of real portions in the sequence of complex numbers inputting of which has been accepted by the complex input section.

Further, the imaginary filter section filters a sequence of imaginary portions in the sequence of complex numbers inputting of which has been accepted by the complex input section.

And, the complex output section outputs a sequence of complex numbers whose real portions are the sequence output by the real filter section and whose imaginary portions are the sequence output by the imaginary filter section.

Meanwhile, each of the real filter section and the imaginary filter section is the filter apparatus with respect to a predetermined real impulse constant r, a predetermined real number constant x, a predetermined delay time constant D and a predetermined positive integer M.

A spread modulation apparatus according to a further aspect of the invention uses the above-described complex filter apparatus, has a scramble section and a modulation section and is constructed as follows.

That is, the scramble section outputs a complex number that is a real portion and imaginary portion of an input digital complex number scrambled with a predetermined spreading code of a chip rate 1/D.

Further, the modulation section spread-modulates the complex number output from the scramble section by giving it to the complex filter apparatus as an input.

In the spread modulation apparatus of the invention, scrambling by the scramble section can be constructed so as to conform to the IMT-2000 W-CDMA system standard, CDMA 2000 system standard or Wireless LAN IEEE 802.11b standard.

In the spread modulation apparatus of the invention, the scramble section can be constructed so as to perform scrambling using one of a Gold-code, a Baker sequence and a Walsh-Hadamard code as a spreading code.

In the spread modulation apparatus of the invention, the spreading code of the scramble section can be constructed so as to be given by individual points on an orbit of a map dynamical system having ergodicity.

In the spread modulation apparatus of the invention, the dynamical system having ergodicity in the scramble section can be constructed so as to be a map dynamical system having a Chebyshev's polynomial of a secondary order or higher as a map.

An output apparatus according to a further aspect of is the invention outputs a pseudorandom sequence of a length N ($N \geq 1$) with respect to a predetermined real impulse constant r ($-1 < r < 1$) and a predetermined real number constant C ($C \neq 0$), has a sequence accepting section, a calculation section and a random number output section and is constructed as follows.

That is, the sequence accepting section accepts inputting of spreading codes (z[1], z[2], ..., z[L]) of a length L ($L \geq 1$) as a sequence initial value.

Meanwhile, the calculation section calculates, from the input-accepted (z[1], z[2], ..., z[L]), (z'[1], z'[2], ..., z'[N]) that satisfy $$z'[1] = C \Sigma_{j=1}^{M} (-r)^{M+1-j} z[j];$$

$$z'[2] = C \Sigma_{j=1}^{M} (-r)^{M+1-j} z[j+1];$$

$$z'[N] = C \Sigma_{j=1}^{M} (-r)^{M+1-j} z[j+N-1]$$

with respect to a predetermined positive integer M ($1 \leq M \leq N$, M+N<L).

Further, the random number output section outputs the (z'[1], z'[2], ..., z'[N]) as a pseudorandom sequence.

Calculation in the calculation section is equivalent to a process of properly setting parameters for the filter apparatus and acquiring a part of a sequence, output when (z[1], z[2], ..., z[L]) are given as inputs, as (z'[1], z'[2], ..., z'[N]).

In the output apparatus of the invention, the spreading codes of the length L can be constructed so as to be an orthogonal code sequence (including an M-sequence, Gold-codes, an orthogonal code sequence acquired from a Walsh function, an orthogonal code sequence acquired from a Chebyshev's polynomial, a Baker sequence and a Manchester-coded orthogonal sequence).

In the output apparatus of the invention, the predetermined real impulse constant r can be constructed so as to be equal to $2-3^{1/2}$ in a notation of a fixed point computation with a predetermined accuracy.

In the output apparatus of the invention, the predetermined real impulse constant r can be constructed so as to satisfy $$2-3^{1/2}-0.1 \leq r \leq 2-3^{1/2}+0.1.$$

A transmitting apparatus according to a further aspect of the invention has a sequence accepting section, the above-described output apparatus which outputs a pseudorandom sequence of a length N, a spreading section and a signal transmitting section and is constructed as follows.

That is, the signal accepting section accepts inputting of a transfer signal.

Meanwhile, the spreading section spectrum-spreads the input-accepted transfer signal with the output pseudorandom sequence of the length N as spreading codes.

Further, the signal transmitting section transmits a signal of a result of the spectrum spreading.

The transmitting apparatus of the invention further has a selecting section and a parameter transmitting section and can be constructed as follows.

That is, the selecting section selects spreading codes P=(z[1], z[2], ..., z[L]).

Meanwhile, the parameter transmitting section transmits the selected spreading codes P=(z[1], z[2], ..., z[L]).

Further, the output apparatus accepts the selected spreading codes P=(z[1], z[2], ..., z[L]) as a sequence initial value.

The transmitting apparatus of the invention further has a parameter receiving section and can be constructed as follows.

That is, the parameter receiving section receives spreading codes Q=(z[1], z[2], ..., z[L]).

Meanwhile, the pseudorandom sequence output apparatus accepts the received spreading codes Q=(z[1], z[2], ..., z[L]) as a sequence initial value.

A receiving apparatus according to a further aspect of the invention has signal receiving section, the above-described output apparatus which outputs a pseudorandom sequence of a length N, a despreading section and a signal output section and is constructed as follows.

That is, the signal receiving section receives a signal.

Meanwhile, the despreading section spectrum-despreads the received signal with the output pseudorandom sequence of the length N as spreading codes.

Further, the signal output section outputs a signal of a result of the spectrum despreading as a transfer signal.

The receiving apparatus of the invention further has a selecting section and a parameter transmitting section and can be constructed as follows.

That is, the selecting section selects spreading codes Q=(z[1], z[2], ..., z[L]).

Meanwhile, the parameter transmitting section transmits the selected spreading codes Q=(z[1], z[2], ..., z[L]).

Further, the output apparatus accepts the selected spreading codes Q=(z[1], z[2], ..., z[L]) as a sequence initial value.

The receiving apparatus of the invention further has a parameter receiving section and can be constructed as follows.

That is, the parameter receiving section receives spreading codes P=(z[1], z[2], ..., z[L]).

Meanwhile, the output apparatus accepts the received spreading codes P=(z[1], z[2], ..., z[L]) as a sequence initial value.

The transmitting apparatus, which transmits the P as parameters, can be combined with the receiving apparatus, which receives the P as parameters, into a communication system. In the communication system, the direction of transmission/reception of parameters is the same as the direction of transmission/reception of transfer signals.

The transmitting apparatus, which receives the Q as parameters, can be combined with the receiving apparatus, which transmits the Q as parameters, into a communication system. In the communication system, the direction of transmission/reception of parameters is opposite to the direction of transmission/reception of transfer signals.

A filter method for a predetermined real impulse constant r ($-1<r<1$), a predetermined real number constant x ($x \neq 0$), a predetermined delay time constant D and a predetermined positive integer M ($M>1$), according to a further aspect of the invention, has an input step, a delay amplification step, an adding step and an output step and is constructed as follows.

That is, the input step accepts inputting of an input signal.

Meanwhile, the delay amplification step outputs M signals that are the input-accepted input signal delay-amplified with a delay time $t_0$ and an amplification factor $a_0$, with a delay time $t_1$ and an amplification factor $a_1$, ..., and with a delay time $t_{M-1}$ and an amplification factor $a_{M-1}$, respectively.

Further, the adding step outputs a sum of the delay-amplified and output M signals.

And, the output step outputs the added and output signal.

Meanwhile, $t_0, t_1, \ldots, t_{M-1}$ is an arithmetical progression of a common difference D.

Further, $a_0, a_1, \ldots, a_{M-1}$ is a geometrical progression of a common ratio $-r$ or $-1/r$.

In the filter method of the invention, the delay amplification step has a delay step and an amplification step and can be constructed as follows.

That is, the delay step outputs M signals that are the input-accepted input signal delayed with delay times $t_0, t_1, \ldots, t_{M-1}$, respectively.

Meanwhile, the amplification step outputs M signals that are the delayed and output M signals $s_0, s_1, \ldots, s_{M-1}$ amplified with amplification factors $a_0, a_1, \ldots, a_{M-1}$, respectively.

In the filter method of the invention, the predetermined real impulse constant r can be constructed so as to be equal to $2-3^{1/2}$ in a notation of a fixed point computation with a predetermined accuracy.

In the filter method of the invention, the predetermined real impulse constant r can be constructed so as to satisfy $$2-3^{1/2}-0.1 \leq r \leq 2-3^{1/2}+0.1.$$

A receiving method according to a further aspect of the invention has a signal receiving step, a reception-side filter step, a code generating step, a code-side filter step and a correlation detection step and can be constructed as follows.

That is, the signal receiving step receives signals.

Meanwhile, the reception-side filter step accepts the received signals as an input sequence and filters and outputs it.

Further, the code generating step generates spreading codes.

And, the code-side filter step accepts the generated spreading codes as an input sequence and filters and outputs it.

Meanwhile, the correlation detection step performs correlation detection on a result of filtering in the reception-side filter step with respect to a result of filtering in the code-side filter step to recover the transmitted data signal.

Further, each of the reception-side filter step and the correlation detection step performs a filtering process by the above-described filter method with respect to a predetermined real impulse constant r, a predetermined real number constant x, a predetermined delay time constant D and a predetermined positive integer N.

In the receiving method of the invention, the code generating step can be constructed so as to generate, as spreading codes, an orthogonal code sequence. (including an M-sequence, Gold-codes, an orthogonal code sequence acquired from a Walsh function, an orthogonal code sequence acquired from a Chebyshev's polynomial, a Baker sequence and a Manchester-coded orthogonal sequence; the same applied hereinafter), or a complex orthogonal code sequence in which a real portion and an imaginary portion are respectively composed of different orthogonal code sequences.

The receiving method of the invention can be a complex filter method by accepting a sequence of complex numbers as an input signal in the input step, and outputting a sequence of complex numbers as an output signal in the output step.

A complex filter method according to a further aspect of the invention filters a sequence of complex numbers, has a complex input step, a real filter step, an imaginary filter step and a complex output step and is constructed as follows.

That is, the complex input step accepts inputting of a sequence of complex numbers.

Meanwhile, the real filter step filters a sequence of real portions in the sequence of complex numbers inputting of which has been accepted in the complex input step.

Further, the imaginary filter step filters a sequence of imaginary portions in the sequence of complex numbers inputting of which has been accepted in the complex input step.

And, the complex output step outputs a sequence of complex numbers whose real portions are the sequence output by the real filter step and whose imaginary portions are the sequence output in the imaginary filter step.

Meanwhile, each of the real filter step and the imaginary filter step performs a filtering process by the above-described filter method with respect to a predetermined real impulse constant r, a predetermined real number constant x, a predetermined delay time constant D and a predetermined positive integer M.

A spread modulation method according to a further aspect of the invention uses the above-described complex filter method, has a scramble step and a modulation step and is constructed as follows.

That is, the scramble step outputs a complex number that is a real portion and imaginary portion of an input digital complex number scrambled with a predetermined spreading code of a chip rate 1/D.

Meanwhile, the modulation step spread-modulates the complex number output in the scramble step by giving it to the complex filter method as an input.

In the spread modulation method of the invention, scrambling by the scramble step can be constructed so as to conform to the IMT-2000 W-CDMA system standard, CDMA 2000 system standard or Wireless LAN IEEE 802.11b standard.

In the spread modulation method of the invention, the scramble step can be constructed so as to perform scrambling using one of a Gold-code, a Baker sequence and a Walsh-Hadamard code as a spreading code.

In the spread modulation method of the invention, the spreading code of the scramble step can be constructed so as to be given by individual points on an orbit of a map dynamical system having ergodicity.

In the spread modulation method of the invention, the dynamical system having ergodicity in the scramble step can be constructed so as to be a map dynamical system having a Chebyshev's polynomial of a secondary order or higher as a map.

An output method according to a further aspect of the invention outputs a pseudorandom sequence of a length L ($L \geq 1$) with respect to a predetermined real impulse constant r ($-1 < r < 1$) and a predetermined real number constant C ($C \neq 0$), a sequence accepting step, a calculation step and a random number output step and is constructed as follows.

That is, the sequence accepting step accepts inputting of spreading codes (z[1], z[2], ..., z[L]) of a length N ($N \geq 1$) as a sequence initial value.

Meanwhile, the calculation step calculates, from the input-accepted (z[1], z[2], ..., z[L]), (z'[1], z'[2], ..., z'[N]) that satisfy $$z'[1]=C\Sigma_{j=1}^{M}(-r)^{M+1-j}z[j];$$

$$z'[2]=C\Sigma_{j=1}^{M}(-r)^{M+1-j}z[j+1];$$

$$z'[N]=C\Sigma_{j=1}^{M}(-r)^{M+1-j}z[j+N-1]$$

with respect to a predetermined positive integer M ($1 \leq M \leq N$, M+N<L).

Further, the random number output step outputs the (z'[1], z'[2], ..., z'[N]) as a pseudorandom sequence.

In the pseudorandom sequence output method of the invention, the spreading codes of the length L can be constructed so as to be an orthogonal code sequence (including an M-sequence, Gold-codes, an orthogonal code sequence acquired from a Walsh function, an orthogonal code sequence acquired from a Chebyshev's polynomial, a Baker sequence and a Manchester-coded orthogonal sequence).

In the pseudorandom sequence output method of the invention, the predetermined real impulse constant r can be constructed so as to be equal to $2-3^{1/2}$ in a notation of a fixed point computation with a predetermined accuracy.

In the pseudorandom sequence output method of the invention, the predetermined real impulse constant r can be constructed so as to satisfy $$2-3^{1/2}-0.1 \leq r \leq 2-3^{1/2}+0.1.$$

A transmitting method according to a further aspect of the invention has a signal accepting step, a random number output step, a spreading step and a signal transmitting step and is constructed as follows.

That is, the signal accepting step accepts inputting of a transfer signal.

Meanwhile, the random number output step outputs a pseudorandom sequence by the above-described output method, which outputs a pseudorandom sequence of a length N.

Further, the spreading step spectrum-spreads the input-accepted transfer signal with the output pseudorandom sequence of the length N as spreading codes.

And, the signal transmitting step transmits a signal of a result of the spectrum spreading.

The transmitting method of the invention may have a selecting step and a parameter transmitting step and can be constructed as follows.

That is, the selecting step selects spreading codes P=(z[1], z[2], ..., z[L]).

Meanwhile, the parameter transmitting step transmits the selected spreading codes P=(z[1], z[2], ..., z[L]).

Further, the random number output step accepts the selected spreading codes P=(z[1], z[2], ..., z[L]) as a sequence initial value.

The transmitting method of the invention further has a parameter receiving step and can be constructed as follows.

That is, the parameter receiving step receives spreading codes Q=(z[1], z[2], ..., z[L]).

Meanwhile, the random number output step accepts the received spreading codes $Q=(z[1], z[2], \ldots, z[L])$ as a sequence initial value.

A receiving method according to a further aspect of the invention has a signal receiving step, a random number output step, a despreading step and a signal output step and is constructed as follows.

That is, the signal receiving step receives a signal.

Meanwhile, the random number output step outputs a pseudorandom sequence by the above-described output method which outputs a pseudorandom sequence of a length N.

Further, the despreading step spectrum-despreads the received signal with the output pseudorandom sequence of the length N as spreading codes.

And, the signal output step outputs a signal of a result of the spectrum despreading as a transfer signal.

The receiving method of the invention has a selecting step and a parameter transmitting step and can be constructed as follows.

That is, the selecting step selects spreading codes $Q=(z[1], z[2], \ldots, z[L])$.

Meanwhile, the parameter transmitting step transmits the selected spreading codes $Q=(z[1], z[2], \ldots, z[L])$.

Further, the random number output step accepts the selected spreading codes $Q=(z[1], z[2], \ldots, z[L])$ as a sequence initial value.

The receiving method of the invention by further has a parameter receiving step and can be constructed as follows.

That is, the parameter receiving step receives spreading codes $P=(z[1], z[2], \ldots, z[L])$.

Meanwhile, the random number output step accepts the received spreading codes $P=(z[1], z[2], \ldots, z[L])$ as a sequence initial value.

A program according to a further aspect of the invention is constructed so as to allow a computer to function as an input section, a delay amplification section, an adding section and an output section with respect to a predetermined real impulse constant r ($-1<r<1$), a predetermined real number constant x ($x\neq 0$), a predetermined delay time constant D and a predetermined positive integer M ($M>1$).

That is, the input section accepts inputting of an input signal.

Meanwhile, the delay amplification section outputs M signals that are the input-accepted input signal delay-amplified with a delay time to and an amplification factor $a_0$, with a delay time $t_1$ and an amplification factor $a_1, \ldots$, and with a delay time $t_{M-1}$ and an amplification factor $a_{M-1}$, respectively.

Further, the adding section outputs a sum of the delay-amplified and output M signals.

And, the output section outputs the added and output signal.

Meanwhile, $t_0, t_1, \ldots, t_{M-1}$ is an arithmetical progression of a common difference D.

Further, the $a_0, a_1, \ldots, a_{M-1}$ is a geometrical progression of a common ratio $-r$ or $-1/r$.

The program of the invention can be constructed so as to function, instead of the delay amplification section, as "a delay section and an amplification section" as follows.

That is, the delay section outputs M signals $s_0, s_1, \ldots, s_{M-1}$ that are the input-accepted input signal delayed with delay times $t_0, t_1, \ldots, t_{M-1}$, respectively.

Meanwhile, the amplification section outputs M signals that are the delayed and output M signals $s_0, s_1, \ldots, s_{M-1}$ amplified with amplification factors $a_0, a_1, \ldots, a_{M-1}$, respectively.

In the program of the invention, the predetermined real impulse constant r can be constructed so as to be equal to $2-3^{1/2}$ in a notation of a fixed point computation with a predetermined accuracy.

A program according to a further aspect of the invention allows a computer to function as a sequence accepting section and a random number output section as follows in such a way that the computer outputs a pseudorandom sequence of a length N ($N\geq 1$) with respect to a predetermined real impulse constant r ($-1<r<1$) and a predetermined real number constant C ($C\neq 0$).

That is, the sequence accepting section accepts inputting of spreading codes $(z[1], z[2], \ldots, z[L])$ of a length N ($N\geq 1$) as a sequence initial value.

Meanwhile, the random number output section is a calculation section which calculates, from the input-accepted $(z[1], z[2], \ldots, z[L])$, $(z'[1], z'[2], \ldots, z'[N])$ that satisfy $$z'[1]=C\Sigma_{j=1}^{M}(-r)^{M+1-j}z[j];$$

$$z'[2]=C\Sigma_{j=1}^{M}(-r)^{M+1-j}z[j+1];$$

$$z'[N]=C\Sigma_{j=1}^{M}(-r)^{M+1-j}z[j+N-1]$$

with respect to a predetermined positive integer M ($1\leq M\leq N$, M+N<L), and outputs the $(z'[1], z'[2], \ldots, z'[N])$ as a pseudorandom sequence.

The program of the invention can be functioned in such a way that in the computer, the spreading codes of the length L are functioned as an orthogonal code sequence (including an M-sequence, Gold-codes, an orthogonal code sequence acquired from a Walsh function, an orthogonal code sequence acquired from a Chebyshev's polynomial, a Baker sequence and a Manchester-coded orthogonal sequence).

The program of the invention can be constructed in such a way that the predetermined real impulse constant r is equal to $2-3^{1/2}$ in a notation of a fixed point computation with a predetermined accuracy.

The program of the invention can be recorded on a computer readable information recording medium (including a compact disk, flexible disk, hard disk, magneto-optical disk, digital video disk, magnetic tape or semiconductor memory).

The above-described various apparatuses and various methods can be realized by running the program recorded on the information recording medium of the invention on an information processing apparatus, such as a general-purpose computer, a portable terminal like a portable terminal, a PHS device or a game machine, or a parallel computer, DSP (Digital Signal Processor), FPGA (Field Programmable Gate Array) or the like, which has a memory apparatus, a calculation apparatus, an output apparatus, a communication apparatus, etc.

Further, pseudorandom sequences output by the above-described pseudorandom sequence output apparatus and output method can be recorded on a computer readable information recording medium.

Further, it is possible to distribute and sell the program of the invention itself and distribute and sell the information recording medium of the invention via a computer communication network, independent of those apparatuses.

BEST MODE FOR CARRYING OUT THE INVENTION

Embodiments of the present invention will be described below. The embodiments described below are illustrative and do not restrict the scope of the invention. It is therefore possible for those skilled in the art to employ embodiments in which those individual elements or all the elements are replaced with their equivalent elements, but those embodiments are also included in the scope of the invention.

First Embodiment

Figure 1:
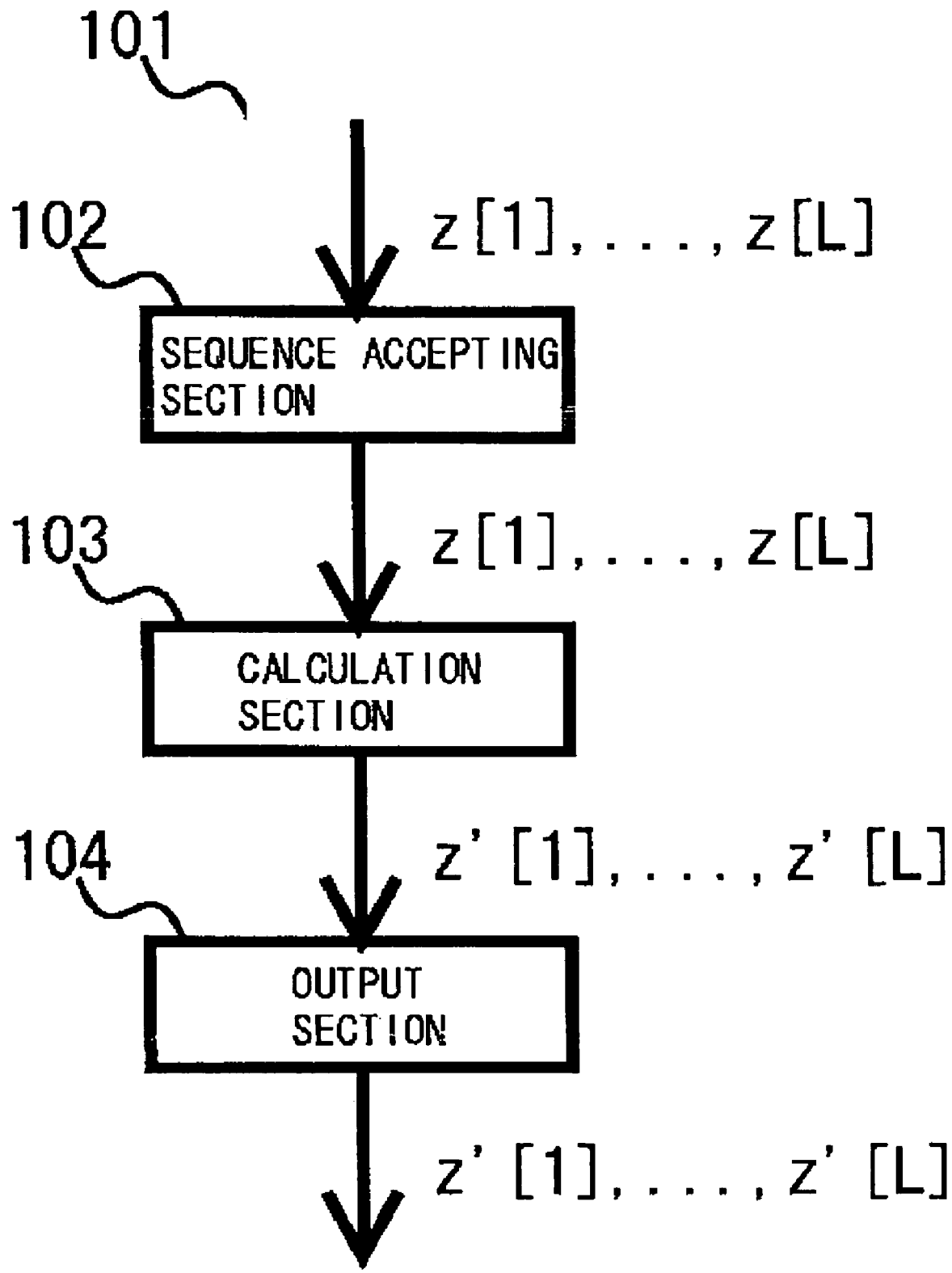
FIG. 1 is an exemplary diagram of the schematic structure of a pseudorandom sequence output apparatus according to the present invention.

FIG. 1 is an exemplary diagram (data flow diagram) showing the schematic structure of a pseudorandom sequence output apparatus according to the first embodiment of the invention. Description will be given below referring to this diagram.

An pseudorandom sequence output apparatus 101 according to this embodiment outputs a pseudorandom sequence of a length L (L≧1) with respect to a predetermined real impulse constant r (−1<r<1) and a predetermined real number constant C (C≠0), and has a sequence accepting section 102, a calculation section 103 and an output section 104.

That is, the sequence accepting section 102 accepts inputting of spreading codes z[1], z[2], . . . , z[L] of a length L (L≧1) as sequence initial values.

Meanwhile, the calculation section 103 calculates, from the input-accepted z[1], z[2], . . . , z[L]), (z'[1], z'[2], . . . , z'[N] that satisfy $$z'[1]=C\Sigma_{j=1}^{M}(-r)^{M+1-j}z[j];$$

$$z'[2]=C\Sigma_{j=1}^{M}(-r)^{M+1-j}z[j+1];$$

$$z'[N]=C\Sigma_{j=1}^{M}(-r)^{M+1-j}z[j+N-1]$$

with respect to a predetermined positive integer M ($1 \leq M \leq N$, M+N<L).

Further, the output section 104 outputs the z'[1], z'[2], . . . , z'[N] as pseudorandom sequences.

Computation in the calculation section 103 can be realized by a combination of an adder/subtracter circuit and a multiplier circuit as well as by a polynomial operation by a computer. It may be realized by a floating point operation which guarantees a predetermined precision or can be realized by an operation involving a rational number. This point will be discussed later.

Acceptance of inputting of a sequence initial value and an integer parameter in the sequence accepting section 102 and outputting in the output section 104 can be done via a RAM (Random Access Memory) and a register in a CPU (Central Processing Unit) in case of a computer, and can be achieved by using a latch or the like in case of an electronic circuit.

As apparent from the aforementioned recursion equation, computations for acquiring z'[1], z'[2], . . . , z'[N] are independent of one another, so that computations can be done in parallel with a maximum parallelism N. As they are described by the recursion equation, it is possible to easily execution computations by looped repetitive operations.

As spreading codes to be a sequence initial value, an M-sequence, Gold-codes, Kasami-codes, Walsh-Hadamard orthogonal codes or chaos codes generated by a Chebyshev's polynomial or the like can be used. The following will describe the chaos codes generated by a Chebyshev's polynomial.

Figure 2:
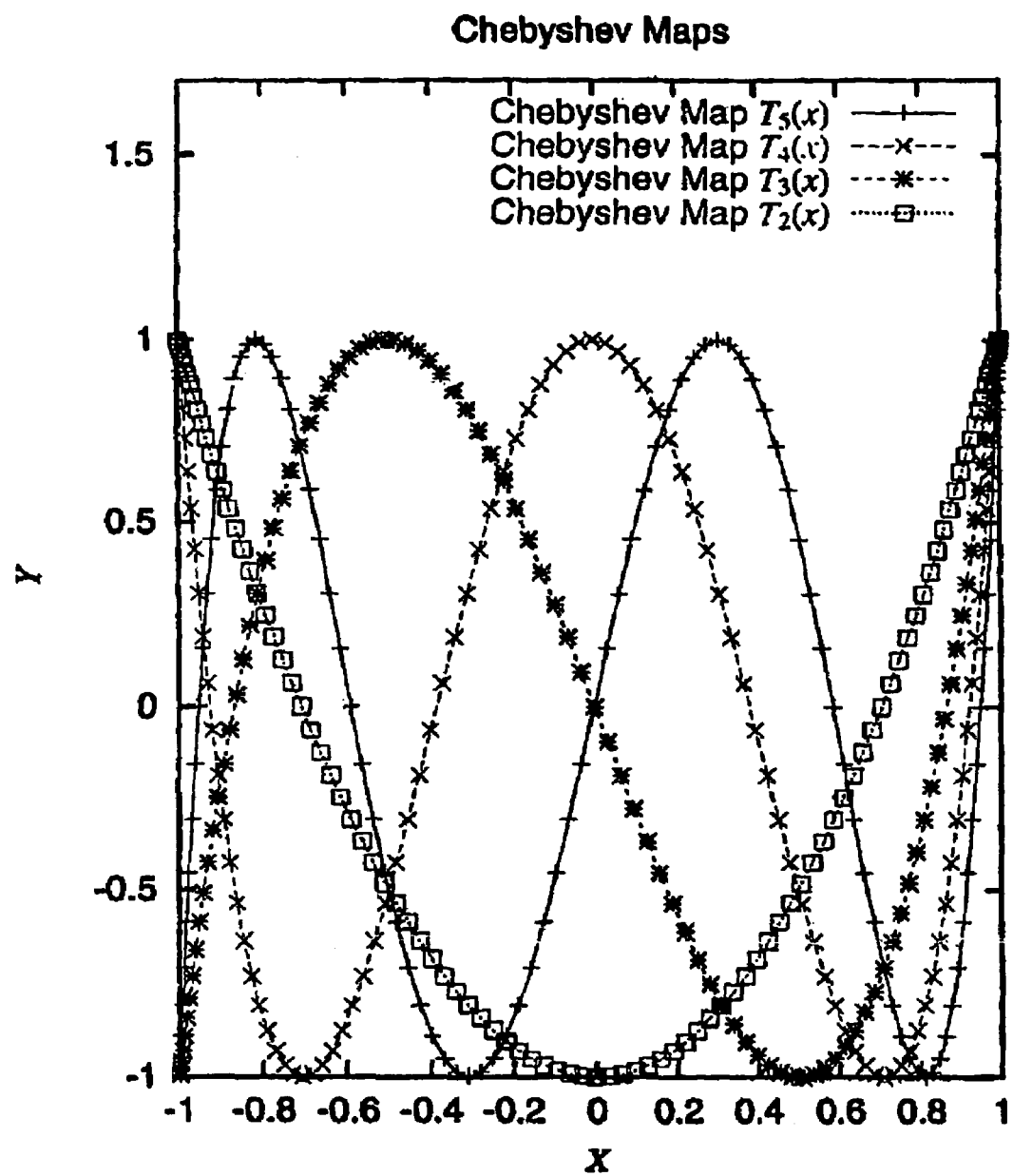
FIG. 2 is a graph showing the outline of a Chebyshev map.

FIG. 2 is a graph showing a Chebyshev's polynomial (Chebyshev map). With an integer a (a≧0) being an order, the Chebyshev's polynomial can be defined by an addition theorem of a cosine function as $$T_a(\cos \theta)=\cos(a\theta).$$

It can also be expressed directly by a rational polynomial as follows.

$$T_0(x)=1;$$

$$T_1(x)=x;$$

$T_2(x)=2x^2-1;$ $T_3(x)=4x^3-3x.$

A Chebyshev's polynomial $y=T_a(x)$ with $a \geq 1$ is a rational map which maps an open zone $-1<x<1$ to an open zone $-1<y<1$.

This diagram shows a Chebyshev's polynomial of the second to fifth orders in a graph in the form of $y=T_2(x)$, $y=T_3(x)$, $y=T4(x)$, $y=T_5(x)$. The horizontal axis is the x axis and the vertical axis is the y axis.

The following are possible chaos codes generated by using such a Chebyshev's polynomial.

The first one is the most fundamental chaos codes which are computed by the following recursion equations.

$z[i+1]=T_a(z[i])$

The second one is an application of the above, which is computed using the recursion equations $y_j[1]=y_j;$ $y_j[m+1]=T(p_j, y_j[m]);$ $z[n]=\Pi_{j=1}^s T(q_j, y_j[n])$ where $T(a,x)=T_a(x)$ with respect to sequence initial values $Y_1, Y_2, \ldots, Y_s$ ($-1<Y_1<1, -1<Y_2<1, \ldots, -1<Y_s<1$), predetermined integer constants $q_1, q_2, \ldots, q_s$, and predetermined integer parameters $p_1, p_2, \ldots, p_s$ (where $q_1$ mod $p_1 \neq 0$, $q_2$ mod $p_2 \neq 0$, \ldots, $q_s$ mod $p_s \neq 0$).

(Theoretical Background 1)

That a correlation function of a pseudorandom sequence of a length N which is output when chaos codes are generaged by a Chebyshev's polynomial becomes the aforementioned optimal correlation function is based on the theory of a Lebesgue spectrum which is developed in the ergodic theory. This theory is disclosed in the following document.

V. I. Arnold and A. Avez "Ergodic Problems of Classical Mechanics" (W. A. Benjamin, New York, 1968)

The theory of the Lebesgue spectrum will be discussed below.

Now, let sequences $X_1, X_2, \ldots$ generated from a dynamical system $X_{n+1}=F(X_n)$ have ergodicity with respect to a limiting density distribution function (invariant measure) $\rho(x)dx$ on an area Q which defines the dynamical system.

Then, Hilbert space $L_2$ in which a norm operation $\|\cdot\|$ is naturally defined as follows $\|v\|^2 = <v,v>$ from an inner product relating to this invariant measure can be considered.

According to the aforementioned document, an orthonormal base $\{\phi_{\lambda,j}\}_{\lambda \in \Lambda, j \in J}$ which satisfies a special property depending on a given dynamical system uniquely exists in this $L_2$ space. This is called a Lebesgue spectrum.

Here, $\lambda$ labels each class of the Lebesgue spectrum and j is a label indicating the function of each class and corresponds to countably many integers of 0 or greater.

It is understood from this definition that the Lebesgue spectrum is an orthonormal function set composed of many functions. Particularly, in case where the number of possible types of the label $\lambda$ (cardinality of $\Lambda$) is infinite, this Lebesgue spectrum is called a infinite Lebesgue spectrum. In case where this Lebesgue spectrum is not only an orthonormal base but also is a complete orthogonal base in the $L_2$ space, this Lebesgue spectrum is called a complete Lebesgue spectrum.

The unique property of the aforementioned Lebesgue spectrum is to satisfy $\phi_{\lambda,j} \circ F = \phi_{\lambda,j+1}$ where $(f \circ g)(x)=f(g(x))$ for every $\lambda \in \Lambda$, $j \in J$.

That is, if every function $\phi_{\lambda,0}$ is given, the Lebesgue spectrum function $\phi_{\lambda,j}$ corresponding to $j \geq 1$ of the class $\lambda$ can be acquired by repeatedly applying a map $F(\cdot)$ which defines a dynamical system.

According to the assumption that the Lebesgue spectrum forms an orthonormal set, those individual functions $\phi_{\lambda,j}$ is orthogonal to a function $\phi_{\lambda,j'}$ for arbitrary other $j \neq j'$ in the same class and an arbitrary function $\phi_{\lambda',j''}$ for $\lambda \neq \lambda'$ in an arbitrary other class.

As an ergodic dynamical system having a complete Lebesgue spectrum, there is a Chebyshev-chaos dynamical system given by a Chebyshev's polynomial of the second order or higher to be discussed later. The Chebyshev-chaos dynamical system is disclosed in the following document.

R. L. Adler, T. J. Rivlin "Proc. Am. Math. Soc. 15" (1964, p 794)

Provided that a function $B(x)$ of $L_2$ can be developed by the Lebesgue spectrum as follows.

$B(x)=\Sigma_{j=1}^N a_{\lambda,j} \phi_{\lambda,j}(x)$

In this case, from the orthogonality of the Lebesgue spectrum, a correlation function $<B(x)B(F^1(x))> \equiv <B_0, B_1>$ is given by a Lebesgue spectrum developing coefficient as follows.

$<B_0, B_1> = \Sigma_{m=1}^\infty a_{\lambda,m} a_{\lambda,m-1}$

Because of the ergodicity, this correlation function is equal to $\lim_{N \to \infty}(1/N)\Sigma_{n=1}^N B(X_n)B(X_{n+1})$ which is the time average of $B(x)B(F^1(x))$.

While each $X_n$ is generated from an recursion equation $X_{n+1}=F(X_n)$, the ergodic equation that the time average is equal to the space average satisfies except for an exceptional initial value $X_1$ of measure 0 on Q.

Suppose that $a_{\lambda,m} = C(-r)^m (m \geq 0)$ where C is a non-zero constant. Substituting this into the equation that gives the above correlation function yields $<B_0,B_1> = C^2(-r)^1(1-r^{2N})/(1-r^2)$ and the correlation function exponentially decreases as follows.

$C(1) \equiv <B_0,B_1> = C'(-r)^1 (N \to \infty)$

As apparent from the above, with regard to a code shift amount 1, a sequence having a correlation function which exponentially dumps in the form of $(-r)^1$ can be created freely with respect to an arbitrary r $(-1<r<1)$.

Particularly, as discovered by Mazzini, in case where z'[1], z'[2], \ldots, z'[N] are selected at the same bit error rate as mentioned above, the theoretical number of users can be increased by 15% from that in the case where random codes (including a Gold-code and Kasami-code) are a spreading sequence.

The spreading sequence that provides the variance of interference noise which becomes $$\sigma_{optimal} = 3^{1/2}(K-1)/(6N)$$

should be such that the asymptotical behavior of its correlation function becomes $$C(s) \cong \text{Const.} \times (-r)^{-s} (0 < r < 1)$$

Therefore, it is sufficient to prepare a filter which is designed as with the ergodic dynamical system having a Lebesgue spectrum and the aforementioned B(x) defined by the Lebesgue spectrum function.

$$a_{\lambda,m} = C(-r)^m (m \geq 0);$$

$$r = 2 - 3^{1/2}$$

The issue here is how the ergodic dynamical system F(x) and the Lebesgue spectrum $\{\phi_{\lambda,j}\}_{\lambda \in \Lambda, j \in J}$ can be constructed in an easily realizable manner. The following will discuss the structure by a Chebyshev map.

Let us consider a Chebyshev's polynomial $T_p(x)$ ($p \geq 2$) of the second order or higher. It is known that this Chebyshev's polynomial is defined by $T_p(\cos \theta) = \cos(p\theta)$ as mentioned above, and is orthogonal to integers p, q where $q \neq p$ under a distribution function $$\rho(x)dx = dx/(\pi(1-x^2))$$

on a closed zone Q=[−1,1] for the value of each p, as follows.

$$\int_M T(p, x) T(q, x) \rho(x) dx = 0$$

Those Chebyshev's polynomial and distribution function can construct the Hilbert space $L_2$. In this case, the Chebyshev's polynomials become an orthogonal base which is complete in the Hilbert space $L_2$.

The aforementioned document discloses that a dynamical system given by Chebyshev maps of the second or higher order has ergodicity and a mixing property stronger than that. The ergodic invariant measure in this case is given by a density function $\rho(x)$ which defines the aforementioned orthogonality.

From those properties, provided that for $j \geq 0$, $q(\mod p) \neq 0$, is a function set $\phi_{q,j}(x)$ defined as follows $$\phi_{q,j} = T(qp^j, x),$$

it is understood from the orthogonality of the Chebyshev's polynomial itself and a relational equation $$\phi_{q,j}(T(p, x))$$

$$= T(qp^j(T(p, x)))$$

$$= T(qp^{j+1}, x)$$

$$= \phi_{q,j+1}$$

that the function set $\phi_{q,j}(x)$ is a Lebesgue spectrum.

Thus, if a filter is designed, for an integer M ($1 \leq M \leq N$), as $$B(x) = \Sigma_{j=1}^N (-r)^j \phi_{q,j}(x)$$

where $r = 2 - 3^{1/2}$, spreading code for an asynchronous CDMA communication system having a correlation function C(s) $\cong \text{Const.} \times (-r)^{-s}$ can be constructed from the explicit solution of the correlation function of the aforementioned Lebesgue spectrum theory. As mentioned above, this is shown by the Mazzini's theory and the number of users in asynchronous CDMA based on ordinary random codes can be increased by 15% under the condition of a constant bit error rate.

Let us pay attention to $$B(X_1) = \Sigma_{j=1}^M (-r)^j \phi_{q,j}(X_1)$$

$$= \Sigma_{j=1}^M (-r)^j T(qp^j, X_1)$$

$$= \Sigma_{j=1}^M (-r)^j T(q, X_{1+j})$$

are satisfied, and for an arbitrary integer m ($0 \leq m \leq N-1$), $$B(X_m) = \Sigma_{j=1}^M (-r)^j \phi_{q,j}(X_m)$$

$$= \Sigma_{j=1}^M (-r)^j T(qp^j, X_m)$$

$$= \Sigma_{j=1}^M (-r)^j T(q, X_{m+j}).$$

For q=1, $T_{pq}(x) = x$ and this function B(X) satisfies $B(X_m) = \Sigma_{j=1}^M (-r)^j X_{m+j}$.

This means an operation of taking the sum of the results of multiplying sequences $X_{m+1}, X_{m+2}, \ldots, X_{m+j}, \ldots, X_{m+M-1}, X_{m+M}$ ($1 \leq j \leq M$) respectively by a constant given to $C(-r)^{M+1-j}$.

This is non other than the operation of an FIR filter (Finite Impulse Response Filter) which is one of basic filters of digital signal processing.

Therefore, it is possible to construct a fast and low power consumption device which achieves computations according to the invention with this FIR filter. The following will describe such a device.

Embodiment of Filter

Figure 3:
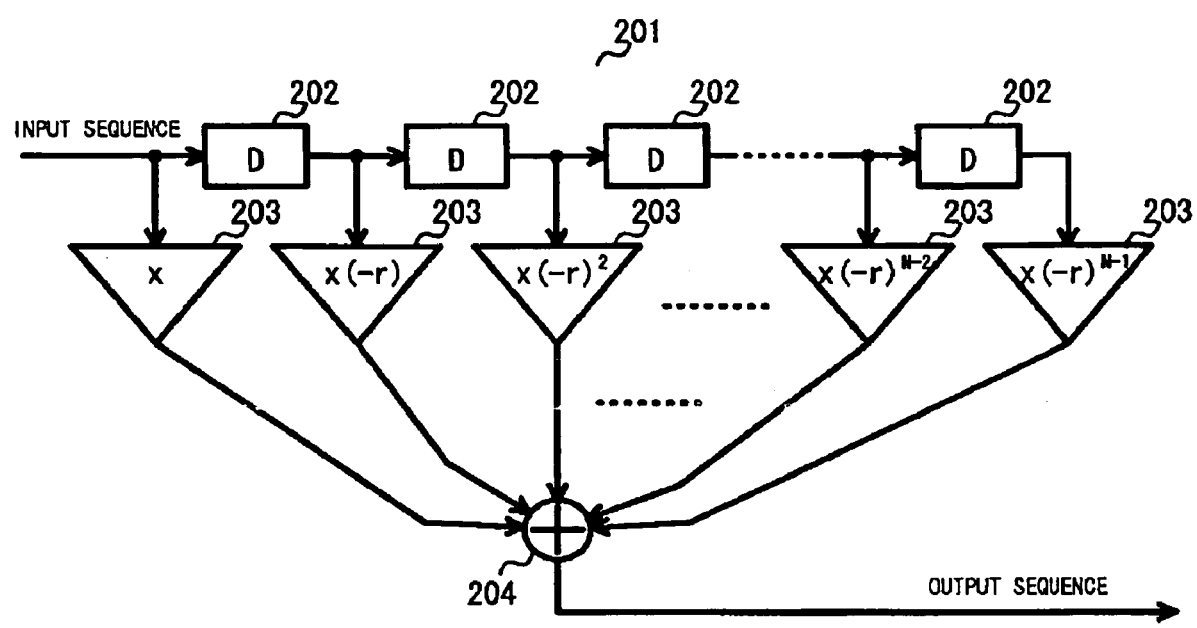
FIG. 3 is an exemplary diagram showing the schematic structure of an FIR filter usable in this embodiment.
Figure 4:
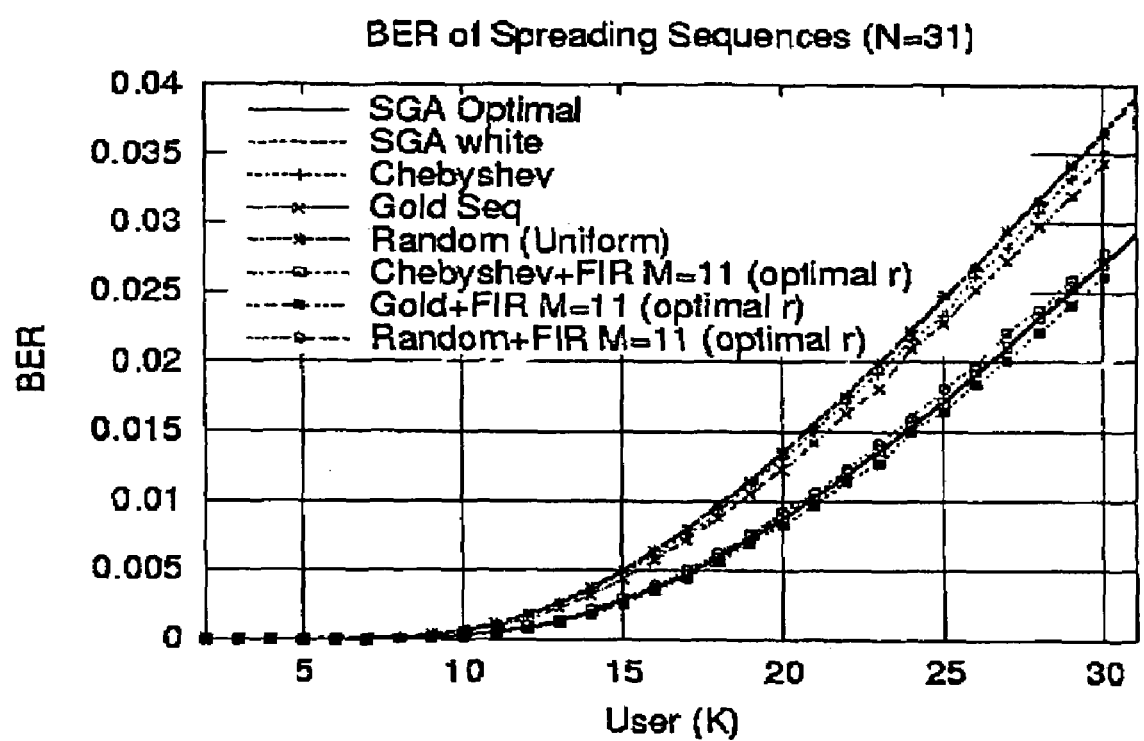
FIG. 4 is a graph showing the simulation results of a bit error rate according to this scheme.
Figure 5:
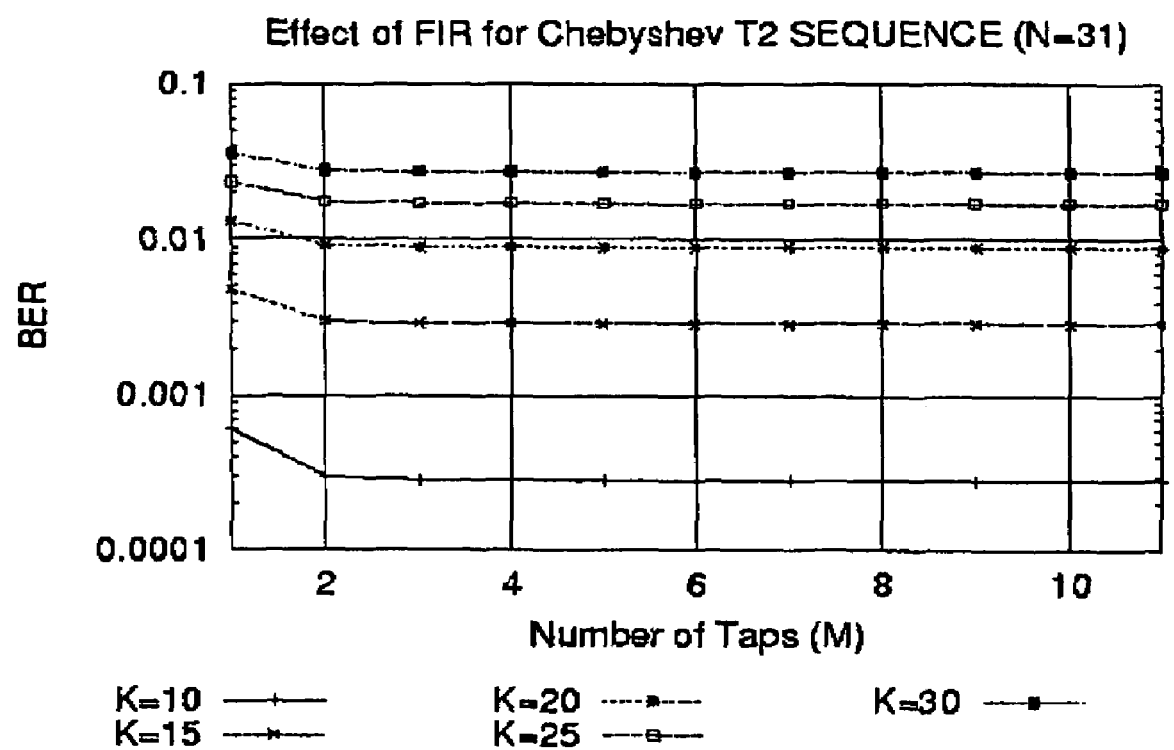
FIG. 5 is a graph showing the simulation results of the bit error rate according to this scheme.
Figure 6:
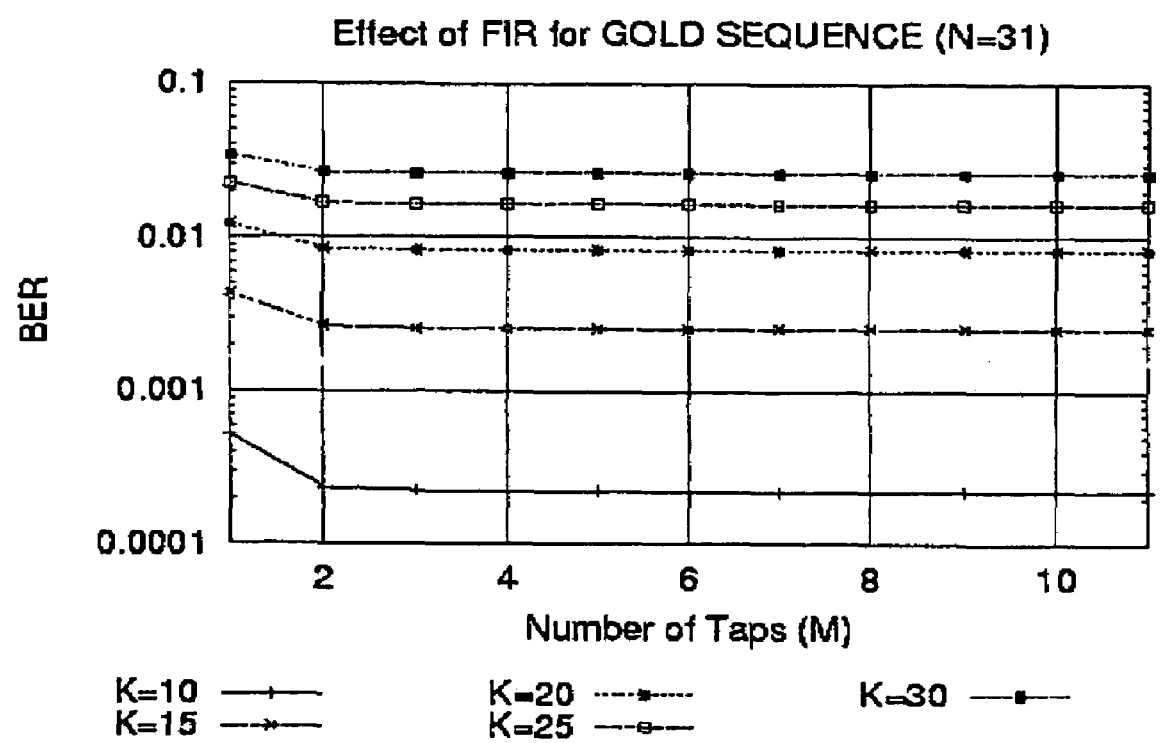
FIG. 6 is a graph showing the simulation results of the bit error rate according to this scheme.
Figure 7:
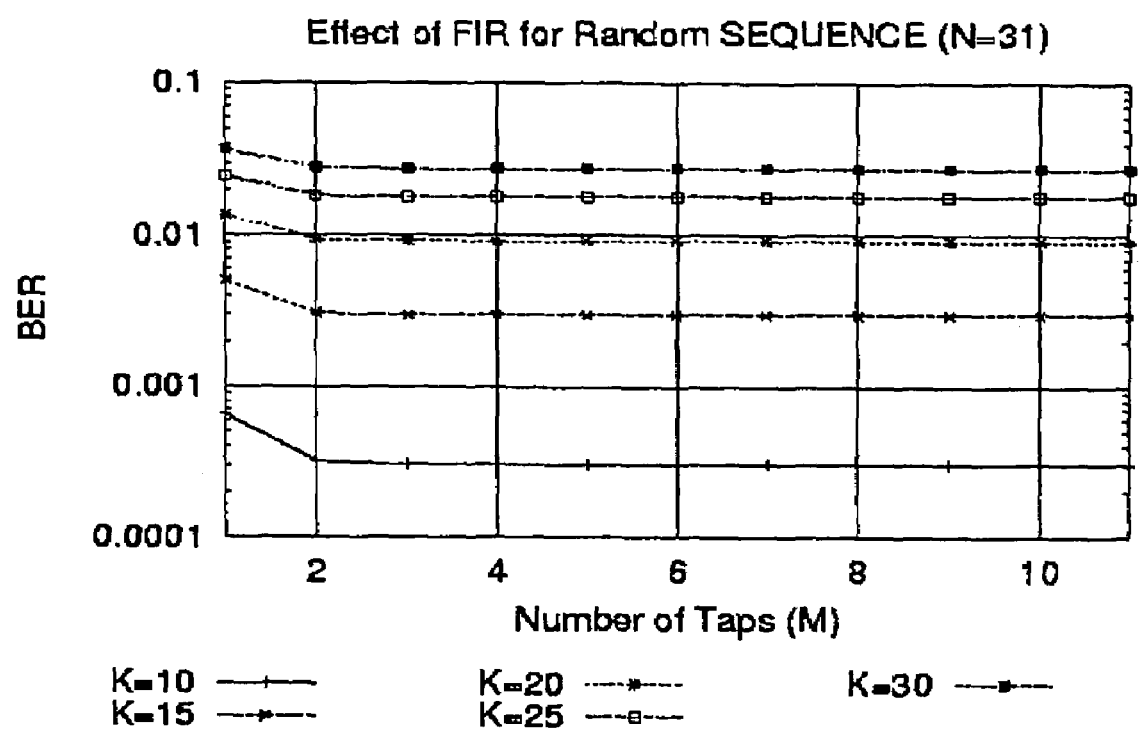
FIG. 7 is a graph showing the simulation results of the bit error rate according to this scheme.
Figure 8:
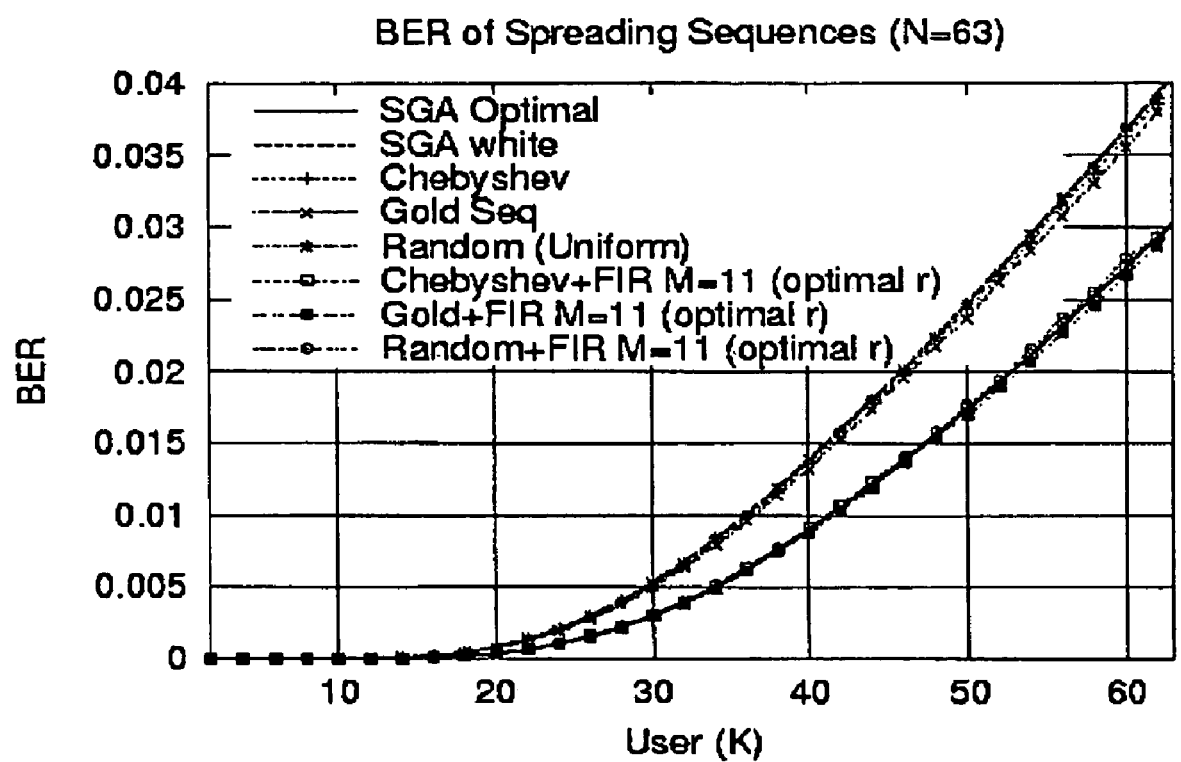
FIG. 8 is a graph showing the simulation results of the bit error rate according to this scheme.
Figure 9:
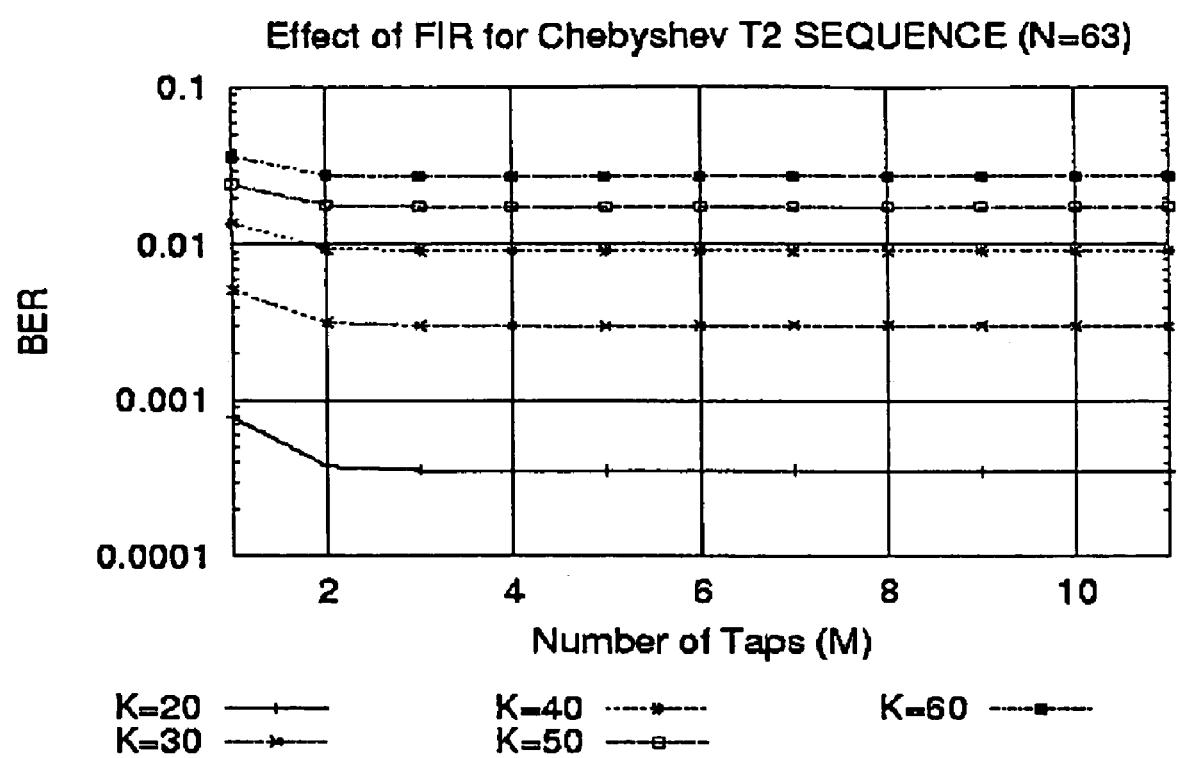
FIG. 9 is a graph showing the simulation results of the bit error rate according to this scheme.
Figure 10:
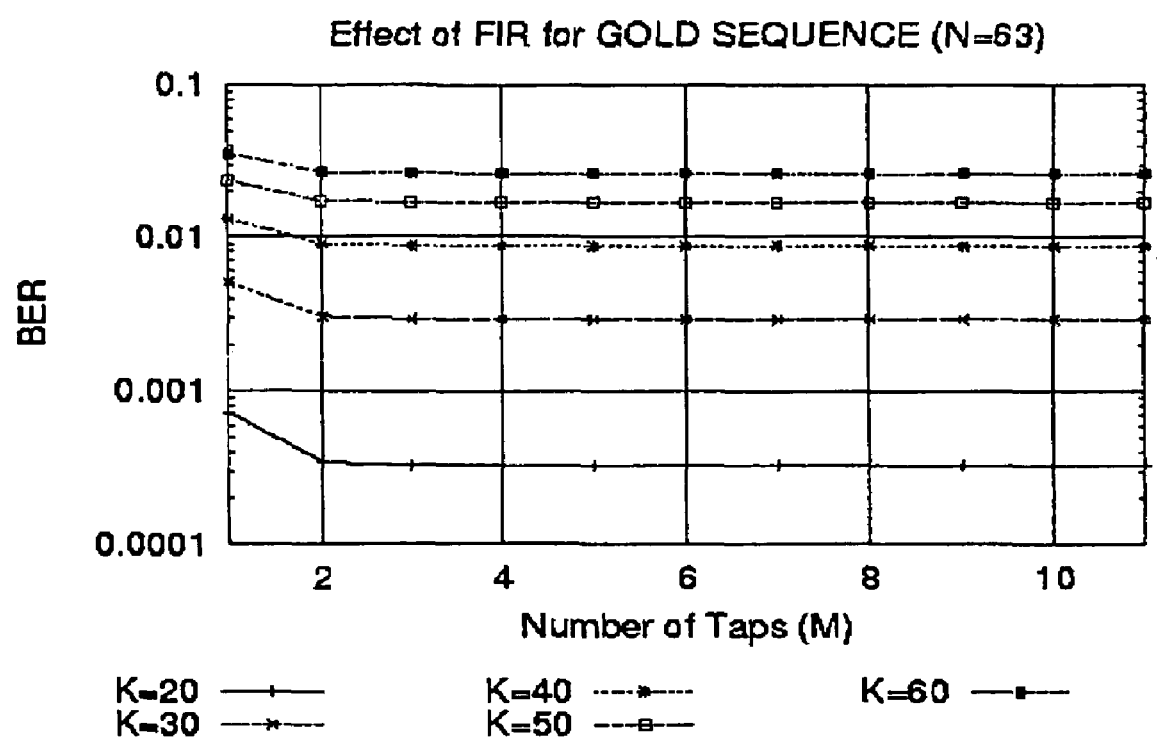
FIG. 10 is a graph showing the simulation results of the bit error rate according to this scheme.
Figure 11:
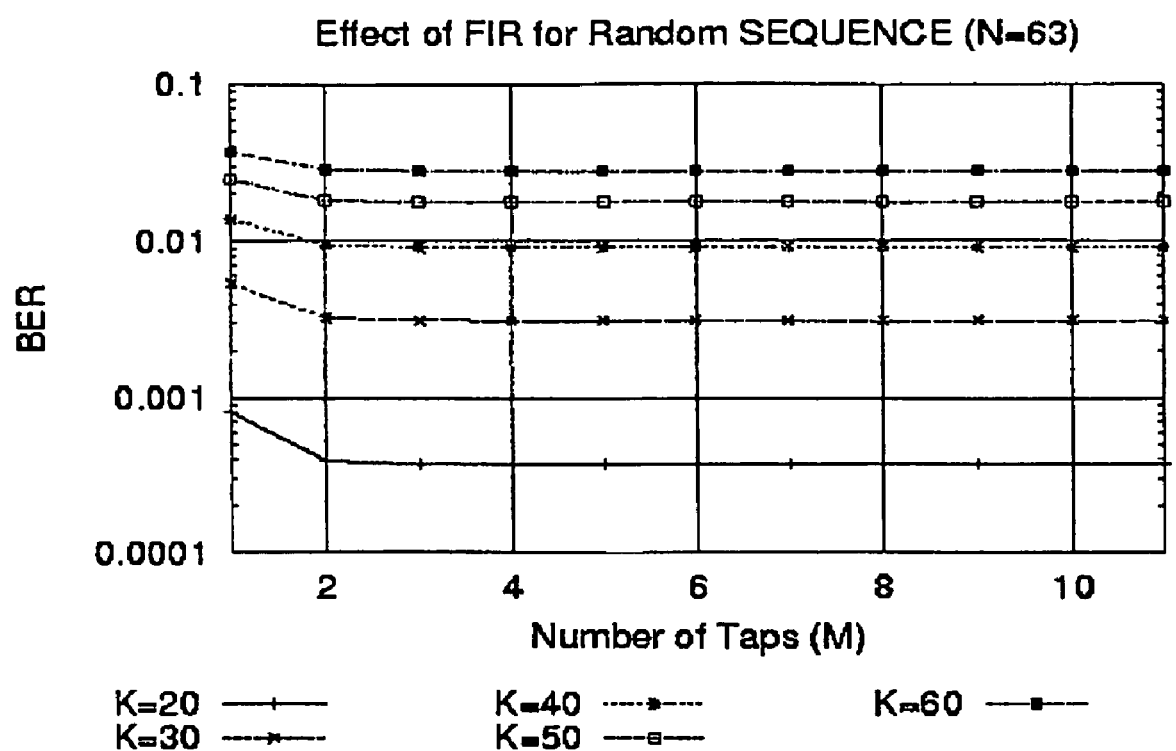
FIG. 11 is a graph showing the simulation results of the bit error rate according to this scheme.
Figure 12:
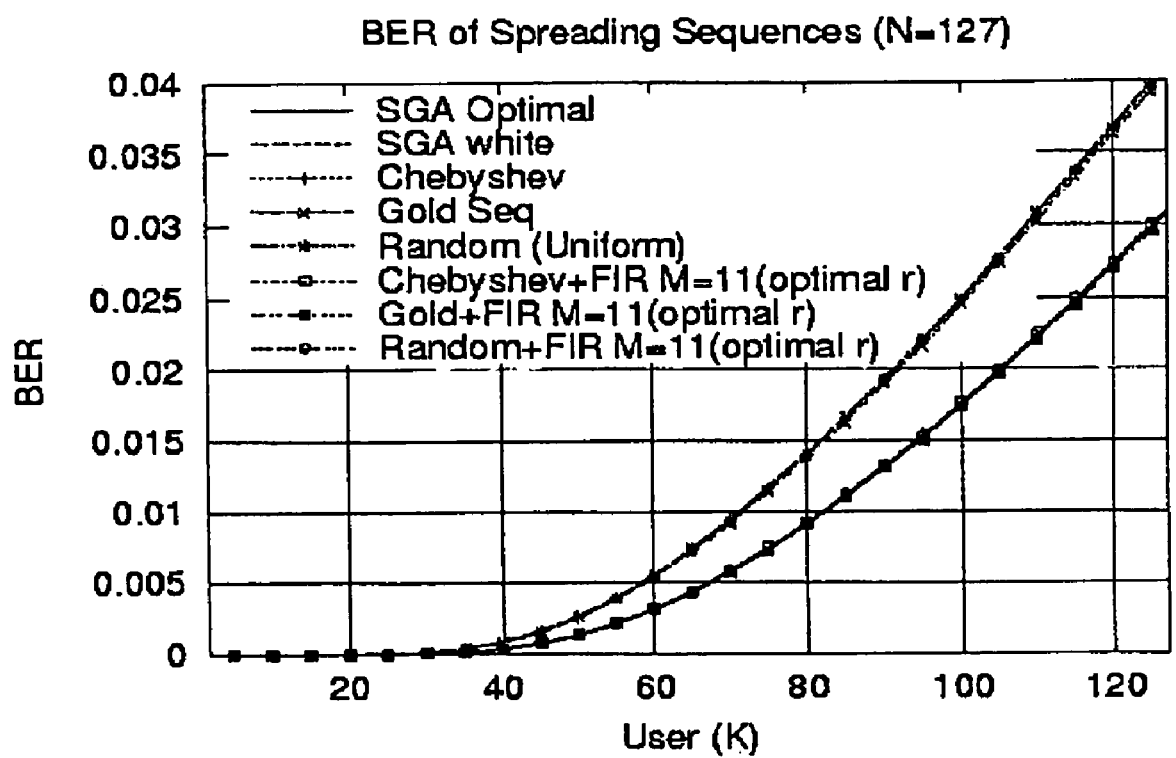
FIG. 12 is a graph showing the simulation results of the bit error rate according to this scheme.
Figure 13:
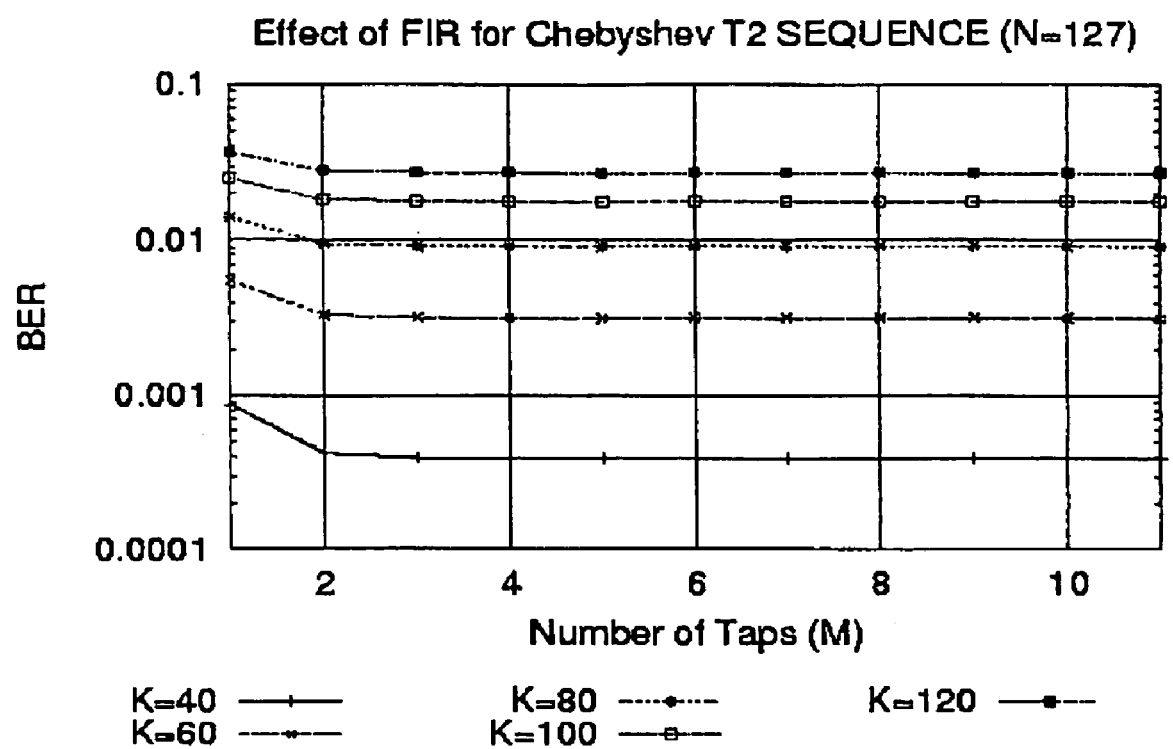
FIG. 13 is a graph showing the simulation results of the bit error rate according to this scheme.
Figure 14:
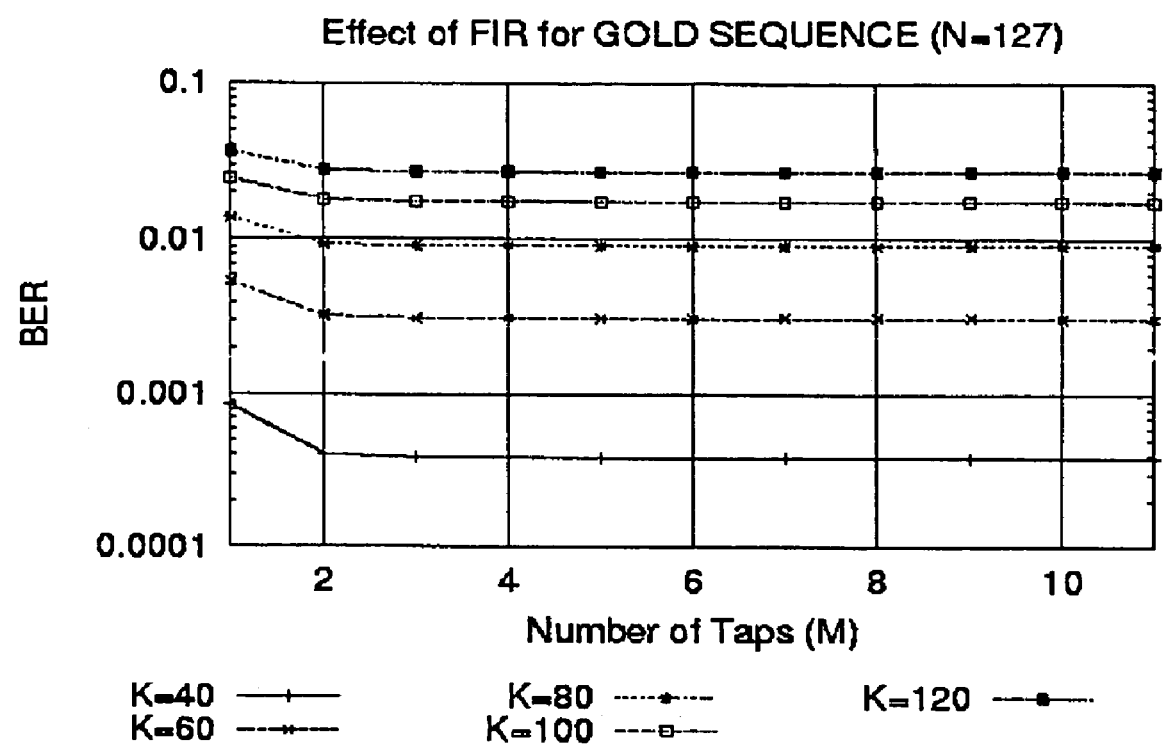
FIG. 14 is a graph showing the simulation results of the bit error rate according to this scheme.
Figure 15:
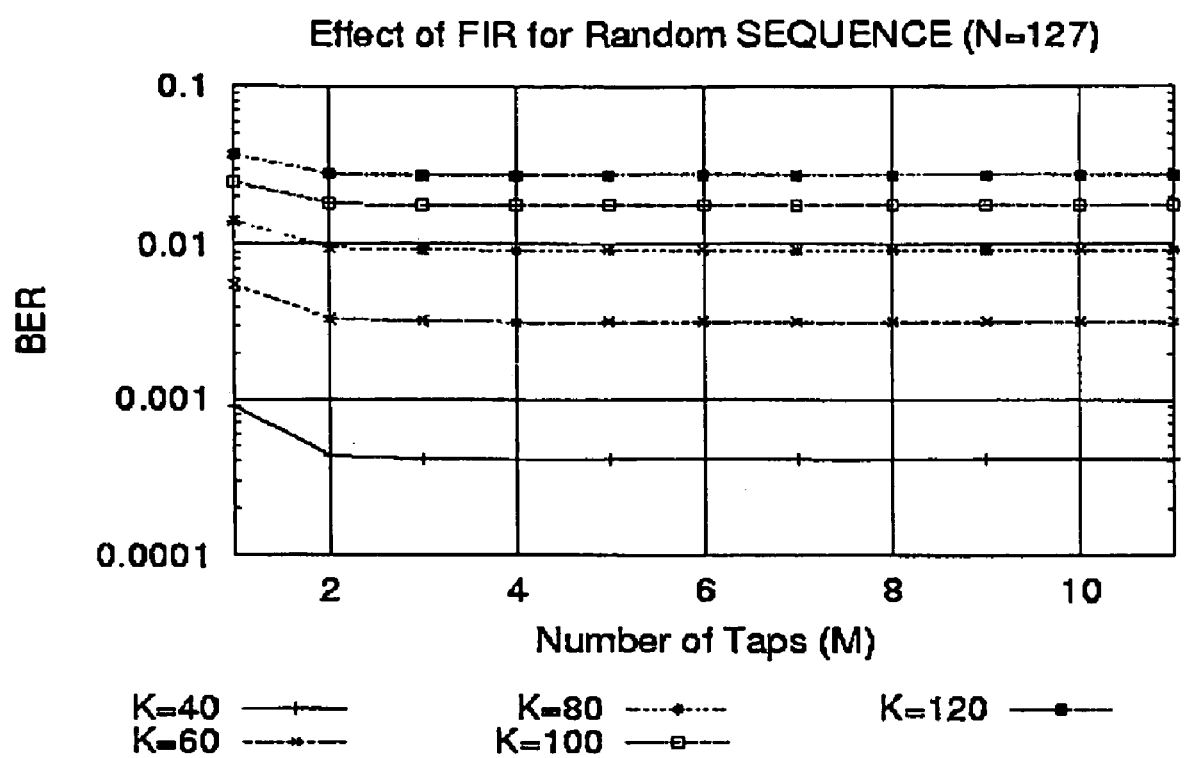
FIG. 15 is a graph showing the simulation results of the bit error rate according to this scheme.

FIG. 3 is an exemplary diagram showing the schematic structure of a filter constructed in such a manner.

A filter 201 accepts inputting of various spreading code sequences $X_1, X_2, X_3, \ldots$, such as a Chebyshev-chaos type spreading code sequence, as an input sequence.

The accepted spreading code sequences are sequentially delayed and distributed by delay circuits 202 connected in series. A delay time is a chip length D. That is, the delay times are 0, D, 2D, 3D, 4D, . . . , (N−1)D. Thus, the delay times become an arithmetical progression with the chip length D as a common difference.

Another delay device may be provided at the preceding stage of the delay circuit 202. In this case, the delay time of each delayed sequence to be given to an amplifier 203 is incremented by the delay time of another delay device. When the delay time of another delay device is set to D, particularly, sequences delayed by D, 2D, 3D, 4D, . . . , ND are input to the amplifiers 203.

The amplifier 203 amplifies a spreading code which sequentially appears between the delay circuits 202. In this diagram, for a predetermined real number constant x, the amplification factors are $x(-r)^1, x(-r)^2, x(-r)^3, \ldots, x(-r)^{M-1}, x(-r)^M$, respectively. That is, the amplification factors become a geometrical progression with r being a common ratio.

The optimal case here is when r is a real impulse constant defined by $2-3^{1/2}$ but even if r does not strictly satisfy that, it can be used to generate spreading codes in an asynchronous CDMA communication system as long as −1<r<1. In case where a fixed point computation is performed, particularly, a value closest to $2-3^{1/2}$ with that accuracy can be used.

Signals amplified by the amplifiers 203 are added by an adder 204 and pseudorandom sequences $Y_1, Y_2, Y_3, \ldots$ are sequentially output as output sequences.

For easier understanding, in case where the delay time of an output with respect to an input is neglected and there is an infinitely long input, when sequences to be input are sequentially ..., $s_{-2}, s_{-1}, s_1, s_2, ...$, the outputs of the FIR filter 201 become ..., $$x(s_{-N-1}(-r)^{N-1}+ ... +s_{-4}(-r)^2+s_{-3}(-r)^1+s_{-2}),$$

$$x(s_{-N}(-r)^{N-1}+ ... +s_{-3}(-r)^2+s_{-2}(-r)^1+s_{-1}),$$

$$x(s_{-N+1}(-r)^{N-1}+ ... +s_{-2}(-r)^2+s_{-1}(-r)^1+s_0),$$

$$x(s_{-N+2}(-r)^{N-1}+ ... +s_{-1}(-r)^2+s_0(-r)^1+s_1),$$

$$x(s_{-N+3}(-r)^{N-1}+ ... +s_0(-r)^2+s_1(-r)^1+s_2), ....$$

With this construction, the delay times of a plurality of delay sequences to be output from the delay circuit 202 are an arithmetical progression with a common difference D and their respective amplification factors are a geometrical progression with a common ratio $(-r)$ or common ratio $(-1/r)$.

Each of those delay circuit 202, amplifiers 203 and adder 204 can be constructed by a simple arithmetic operation circuit. Therefore, arithmetic operations may be performed based on software using a computer or may be performed with exclusive hardware constructed using an ASIC, DSP, FPGA or the like.

Although the delay circuit 202 and the amplifiers 203 are connected by lines efficiently in this embodiment, the same effect can be acquired, for example, by connecting a delay circuit with a delay time 0 and an amplifier with an amplification factor $x(-r)^0$, a delay circuit with a delay time D and an amplifier with an amplification factor $x(-r)^1$, a delay circuit with a delay time D and an amplifier with an amplification factor $x(-r)^2$, ...

a delay circuit with a delay time D and an amplifier with an amplification factor $x(-r)^{N-1}$ in parallel to a terminal which accepts input sequences and connecting the delaying and amplifying results to the adder. In this case, any one of the combinations of the individual delay circuits and amplifiers may be set close to the adder.

(Theoretical Background 2)

Let us go back to the discussion. In case where chaos codes generated by using a Chebyshev's polynomial are used as spreading codes, a code sequence can be set periodic.

That is, when $X_j=X_{j+N+1}$, it is unnecessary to prepare $2N-1$ values $X_1, ..., X_{2N-1}$. Only N $X_1, ..., X_N$ can ensure computation of $B(X_m)$ for every m ($0 \leq m \leq N$) using the periodicity. It is therefore possible to further shorten the computation time.

Likewise, it is understood that the product of the Chebyshev's polynomial $$T(p_1, x_1)T(p_2, x_2) ... T(p_s, x_s)$$

becomes a complete orthogonal base on the s-dimensional cubic $[-1,1]^s$.

In case where this filter 201 is used in the embodiment of the random output apparatus, s products $$z[m]=T(q_1, x_1)T(q_2, x_2) ... T(q_3, x_3)$$

are calculated with respect to s-dimensional real numbers $x_1, x_2, ..., x_3$, respectively generated from a Chebyshev map dynamical system which is determined from s integer parameters $p_1, p_2, ..., p_3$ such that $q_1 \mod p_1 \neq 0$, $q_2 \mod p_2 \neq 0$, ..., $q_s \mod p_s \neq 0$ are respectively satisfied for s predetermined positive integers $q_1, q_2, ..., q_s$, and $1 \leq m \leq 2N-1$.

Then, the correlation function of pseudorandom sequences of the length N created from the computed values $z[1], z[2], ..., z[2N-1]$, $$z'[1]\Sigma_{j=1}^{M}(-r)^j z[j];$$

$$z'[2]\Sigma_{j=1}^{M}(-r)^j z[j+1]; ...$$

$$z'[N]\Sigma_{j=1}^{M}(-r)^j z[j+N+1]$$

satisfies $$C(s)^*\% \text{ Const.} \times (-r)^{-s}.$$

If r is defined as $r=2-3^{1/2}$ and the code length N is set sufficiently long, the variance of interference noise of asynchronous CDMA which has pseudorandom sequences created from the s-dimensional direct product chaos dynamical system as spreading codes is given by $$\sigma_{optimal}=3^{1/2}(K-1)/(6N)$$

from the Mazzini's theory, the number of users at the same bit error rate can surely be increased by 15% as compared with the case of the existing asynchronous CDMA communication system.

If there is F(p, x) which satisfies the relationship (topologically conjugate) of $$F(p, G(x))=G(T(p, x))$$

with respect to a Chebyshev map T(p, x) and a diffeomorphism map G(x), this F(p, x) has a Lebesgue spectrum equivalent to that of a Chebyshev map, and further, a chaos sequence which causes this autocorrelation function to dump like $(-r)^1$ can be Constructed similarly.

(Experimental Results)

The following illustrates the simulation results of computing the bit error rate in the present scheme with respect to the number of users (User) K and the number of taps (Number of Taps) M with the length N of a pseudorandom sequence being fixed. Spreading codes (Spreading Sequence) to be given are Chebyshev codes (Cebyshev), Gold-codes (Gold Seq) and a typical random sequence (Random (Uniform)). The following parameters were used in this scheme.

s=1 p=2 (the order of the Chebyshev generator is equivalent to 2)

FIGS. 4 to 7 correspond to the code length N=31, FIGS. 8 to 11 correspond to the code length N=63, and FIGS. 12 to 15 correspond to N=127.

The results of this scheme are Cebyshef+FIR, Gold Seq+ FIR and Random+FIR in the graphs and acquired with respect to $r=2-3^{1/2}$.

From those simulation results, it is seen that even when any spreading code is used, the number of users increased by 15% at the same bit error rate can be guaranteed as compared with the conventional scheme.

It is also understood that the bit error rate with respect to the tap number M is saturated at about M=2 to 5. Therefore, it is also apparent that such a number is enough for the number of filter stages M.

In addition, it is understood that the spreading codes to be given should not necessarily be chaos codes using a Chebyshev's polynomial.

(Details of Output Method)

Figure 16:
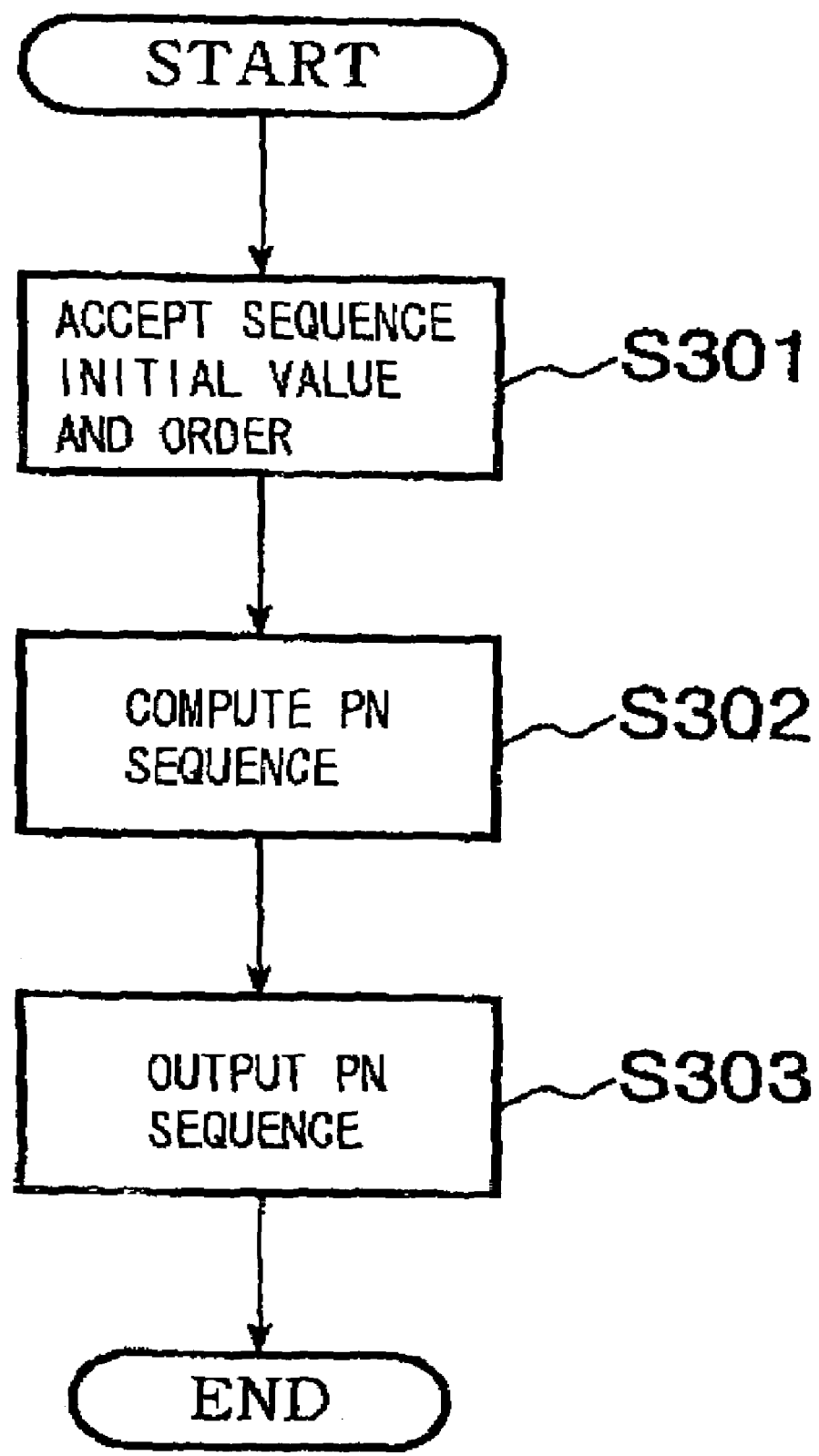
FIG. 16 is a flowchart illustrating the steps of a pseudorandom sequence output method of the invention.

FIG. 16 is a flowchart illustrating a process to be executed in the pseudorandom sequence output apparatus 101, i.e., the steps of the pseudorandom sequence output method of the invention.

The pseudorandom sequence output apparatus 101 accepts a sequence initial value and an integer parameter (step S301), computes a pseudorandom sequence based on them and the aforementioned asymptotical equation (step S302), outputs the computed pseudorandom sequence (step S303), then terminates this process.

As apparent from the above, the pseudorandom sequence output method of the invention can easily be realized by an information processing apparatus, such as a general-purpose computer, a parallel computer, a portable terminal, particularly, a communication terminal, or a game machine.

It is easy to execute the pseudorandom sequence output method of the invention using a digital circuit, such as DSP or FPGA (Field Programmable Gate Array).

(Embodiment of Transmitting Apparatus)

Figure 17:
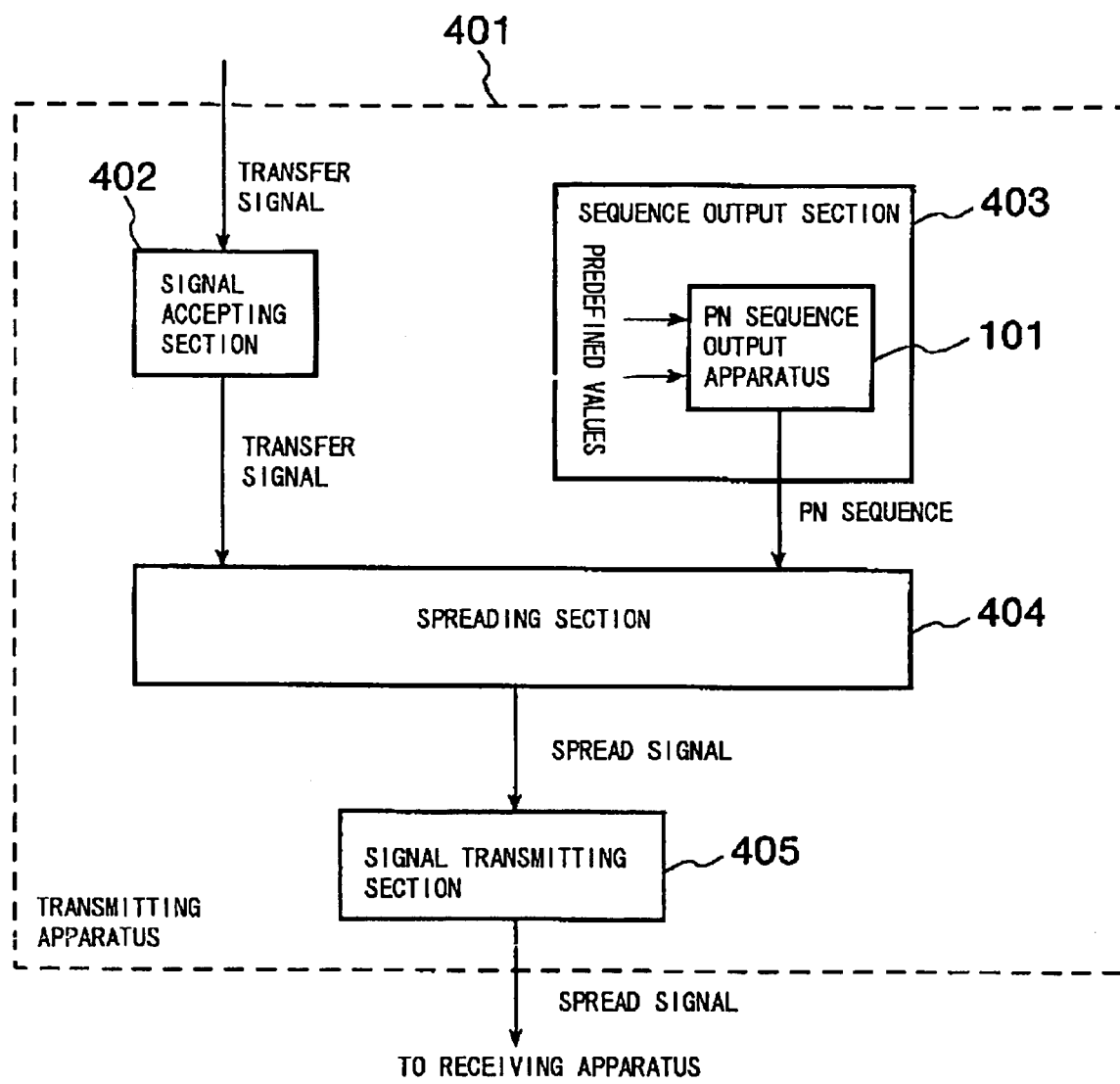
FIG. 17 is an exemplary diagram showing the schematic structure of a transmitting apparatus of the invention.

FIG. 17 is an exemplary diagram showing the schematic structure of a transmitting apparatus of the invention. Same reference symbols are given to the same elements as those in the aforementioned diagrams. A description will be given below referring to this diagram.

A transmitting apparatus 401 has a signal accepting section 402, a sequence output section 403, a spreading section 404 and a signal transmitting section 405. The sequence output section 403 has the pseudorandom sequence output apparatus 101 and controls it.

The signal accepting section 402 accepts signals to be transferred. A typical transfer signal is a voice signal in case of a portable telephone or PHS. In case of executing digital communication, it is an electrical digital signal. In case of executing optical communication, an optical signal may be converted to an electrical signal which is accepted, and in case where the pseudorandom sequence output apparatus 101 is realized by an optical computer, an optical signal is accepted directly.

The sequence output section 403 causes the pseudorandom sequence output apparatus 101 equipped therein to accept a sequence initial value and an integer parameter (order) assigned to the transmitting apparatus 401. Because the pseudorandom sequence output apparatus 101 outputs a pseudorandom sequence as mentioned above, the sequence output section 403 outputs this pseudorandom sequence.

Different values of the sequence initial value and integer parameter (order) can be assigned to different transmitting apparatuses 401 beforehand. While communication terminals which have values, such as a production number, a device number and an acknowledgement number, recorded in a ROM (Read Only Memory), are prevailing, likewise, the sequence initial value and integer parameter (order) can be recorded in the ROM beforehand so that the transmitting apparatus 401 can always use the same sequence initial value and integer parameter (order). Also available is a scheme of recording plural types of sequence initial values and integer parameters (orders) to be used in the ROM and selecting them at random communication by communication.

In case where such an embodiment is taken, the receiving apparatus that communicates with the transmitting apparatus 401 need to know the sequence initial value and integer parameter (order), recorded in the ROM, somehow, but in case where the transmitting apparatus and the receiving apparatus make a pair, it is possible to take an embodiment such that the same sequence initial value and integer parameter (order) are shared and recorded.

In case where there are plural types of sequence initial values and integer parameters (orders), which type is used can be checked by correlation detection to be discussed later. A plurality of sequence initial values may be prepared by using chaos random sequences acquired by the asymptotical equation based on a Chebyshev's polynomial. Further, using a scheme of public key encryption, the transmitting apparatus 401 and the receiving apparatus can securely share the sequence initial value and integer parameter (order), as will be discussed later.

The spreading section 404 performs direct-sequence spectrum spreading by sequentially multiplying the transfer signal accepted by the signal accepting section 402 by the elements of the pseudorandom sequence output from the sequence output section 403. Now, with s(t) being the value of a signal at time t, a scheme of "multiplying the signal s(t) by the elements of a sequence sequentially" will be described.

In case of using the elements of a sequence with a length N, from that and the chip length w of the direct-sequence spectrum spreading, the period of "multiplying the signal s(t) by the elements of a sequence sequentially" becomes Nw.

In case of "multiplying the signal s(t) by the elements of a sequence sequentially" from a predetermined time $t_0$, the signal s(t) is discretized with the chip length w which provides the necessary accuracy. For example, a scheme of acquiring the value of the signal set) for each chip length w, a scheme of acquiring the average of the values of the signal s(t) over the chip length w or the like are feasible. To clarify the description, the description will be given referring to the former scheme.

While the chip length w should be so set as to be able to sufficiently decode information of the transfer signal on the receiving apparatus side with the required quality, the proper chip length can be selected by a known technique.

If the proper chip length w is selected, signals with a sufficient quality as seen from the original transfer signal can be acquired by outputting the discrete signal sequence in order over the chip length w.

The discrete signals can be expressed by the following numerical sequence.

$$s(t_0), s(t_0+w), s(t_0+2w), s(t_0+3w), s(t_0+4w), \ldots$$

For an integer i (0≦i), it can be arranged as $$s_i = s(t_0+iw).$$

The scheme of obtaining the average of the values of the signal s(t) over the chip length w can arrange it as follows.

$$s_i = (1/w)\int_0^w s(t_0+iu)du.$$

Those signal sequences $s_i$ (0≦i) are the transfer signal discretized with the required quality.

Signal sequences spreaded by direct-sequence spectrum spreading with those signal sequences become as follows.

$$s_0 z'[1], s_1 z'[2], \ldots, s_{M-1} z'[N], s_N z'[1], s_{N+1} z'[2], \ldots$$

That is, for the integer i (0≦i), $s_i$xz'[(i mod N)+1] is the general term of this numerical sequence. Here, x mod y means the remainder of dividing x by y.

By transmitting the elements of the signal sequence over the period of the chip length, the accepted transfer signal of a predetermined time length can be transmitted over the same time length.

Figure 18:
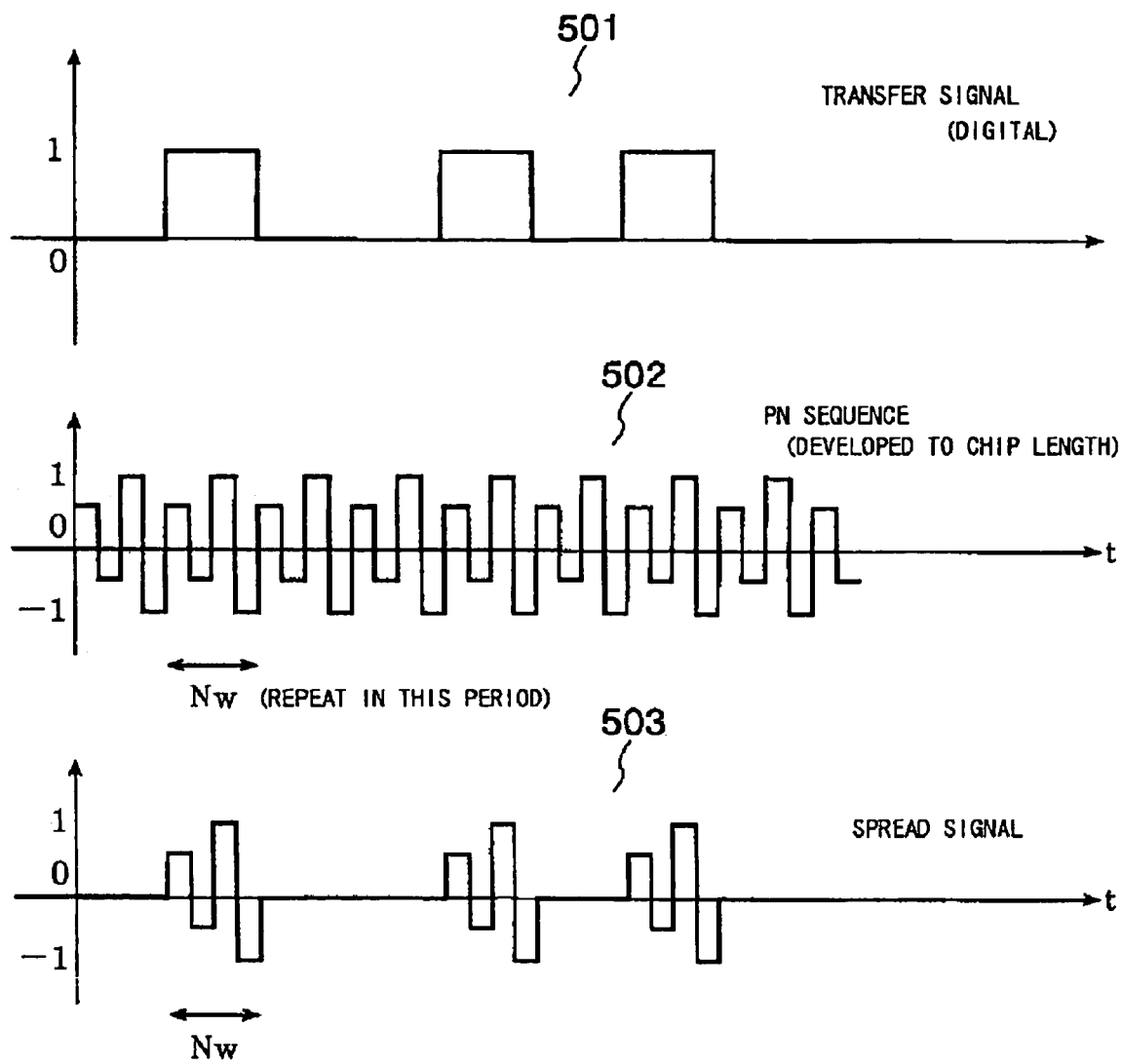
FIG. 18 is an explanatory diagram showing the behavior of direct spectrum spreading.

FIG. 18 shows the behavior of direct-sequence spectrum spreading. A signal 503 to be output from the spreading section 404 is acquired by repeatedly multiplying a transfer signal 501, accepted by the signal accepting section 402, by the elements of a pseudorandom sequence 502 output from the sequence output section 403.

The signal transmitting section 405 transmits the signal 503, output by the spreading section 404. The transmission is carried out via an antenna in case of a portable telephone or PHS, or via a cable telephone circuit, a cable/wireless LAN circuit or an optical cable in case of a computer communication network.

Embodiment of Receiving Apparatus

Figure 19:
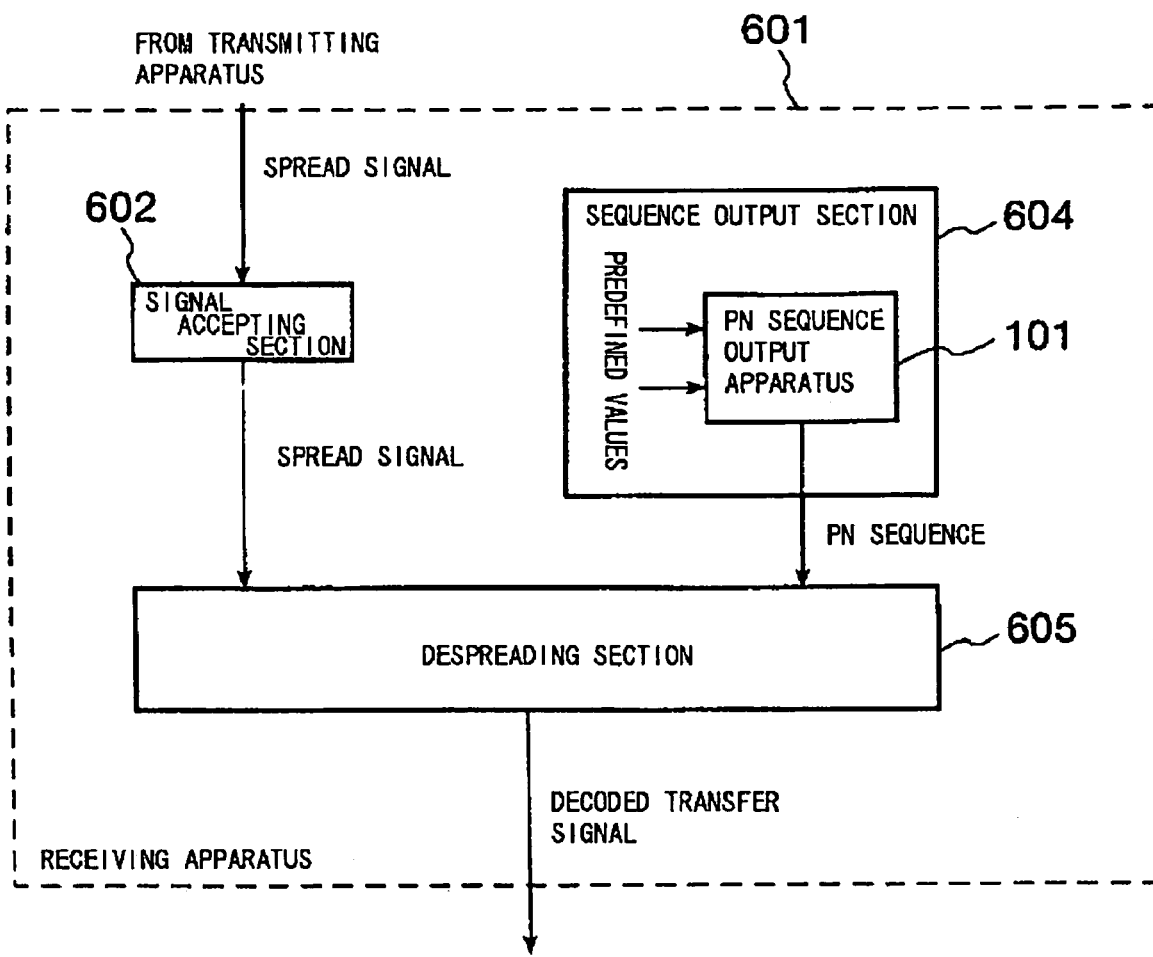
FIG. 19 is an exemplary diagram showing the schematic structure of a receiving apparatus of the invention.

Like the above-described transmitting apparatus, the receiving apparatus of the invention acquires a pseudorandom sequence using the above-described pseudorandom sequence output apparatus and uses the pseudorandom sequence as spreading codes for direct-sequence spectrum despreading. FIG. 19 is an exemplary diagram showing the schematic structure of the receiving apparatus of the invention. The following description will be given referring to this diagram.

A receiving apparatus 601 has a sequence accepting section 602, a sequence output section 604 and a despreading section 605.

The sequence accepting section 602 receives signals transmitted by the transmitting apparatus 401. The sequence accepting section 602 is realized by an interface with respect to, for example, an antenna, a telephone circuit, an optical cable circuit or the like.

The signal that is received by the sequence accepting section 602 contains a signal or noise transmitted by other transmitting apparatuses 401 than that of the communicating party. To eliminate those unnecessary signals, the same pseudorandom sequence as the one used in direct sequence spectrum spreading by the transmitting apparatus 401 of the communicating party is used. The sequence output section 604 outputs this pseudorandom sequence by allowing the pseudorandom sequence output apparatus 101 to accept the sequence initial value and integer parameter (order) used by the transmitting apparatus 401 of the communicating party. Therefore, the embodiment of the sequence output section 604 of the receiving apparatus 601 is similar to the sequence output section 403 of the transmitting apparatus 401.

To decode the transfer signal that has been accepted by the transmitting apparatus 401 of the communicating party, the signal transmitted by the transmitting apparatus 401 of the communicating party should be multiplied sequentially by the reciprocals of the elements of the pseudorandom sequence to execute direct sequence spectrum despreading.

With synchronization provided, as the received signal sequences $s_0 z'[1], s_1 z'[2], \ldots, s_{M-1} z'[N], s_N z'[1], s_{N+1} z'[2], \ldots$ are sequentially multiplied by the reciprocals of the elements of the pseudorandom sequence $1/z'[1], 1/z'[2], \ldots, 1/z'[N]$ in the despreading section 605, signal sequences resulting from decoding of the information of the transfer signal with the required quality, $$s_0, s_1, \ldots, s_{M-1}, s_N, s_{N+1}, \ldots$$

are acquired. Outputting the signal sequences over the chip length w sequentially can cause the transfer signal to be recovered with the required quality.

Various schemes, such as correlation detection to be discussed later and a scheme which shares clocks, are feasible for synchronization and those embodiments are also included in the scope of the invention.

Using the public key encryption scheme by which the transmitting apparatus 401 and the receiving apparatus 601 communicate with each other as will be discussed below, a generating section 611 of the receiving apparatus 601 can generate the same sequence initial value and integer parameter (order) as the transmitting apparatus 401 does.

First, the receiving apparatus 601 generates a pair of a public key and a private key. Next, the receiving apparatus 601 transmits the public key to the transmitting apparatus 401. The transmitting apparatus 401 encrypts the sequence initial value and integer parameter (order) used by itself with the public key and transmits them to the receiving apparatus 601. The receiving apparatus 601 decodes the transmitted encrypted code with the private key to acquire the sequence initial value and integer parameter (order).

As such a public key encryption scheme, chaos encryption as disclosed by the present inventor in Japanese Patent Application No. 152063/1999 can be used.

(Other Embodiments of Spreading/Despreading)

In addition to the above-described embodiments, the following embodiments can be employed at the time of spreading/despreading. That is, let us consider the case of transferring following information data each taking a value of +1 or −1.

$b_1, b_2, b_3, \ldots$

The transmitting apparatus 401 sequentially multiplies the sequence by a pseudorandom sequence as follows.

$b_1 z'[1], b_1 z'[2], \ldots, b_1 z'[N],$ $b_2 z'[1], b_2 z'[2], \ldots, b_2 z'[N],$ $b_3 z'[1], b_3 z'[2], \ldots, b_3 z'[N], \ldots$ The transmitting apparatus 401 transfers the spread signals.

Suppose that the following are the signals received by the receiving apparatus 601.

$s_1, s_2, \ldots, s_N,$ $s_{N+1}, s_{N+2}, s_{2N},$ $s_{2N+1}, s_{2N+2}, \ldots, s_{3N}, \ldots$ The receiving apparatus 601 multiplies them by a pseudorandom sequence sequentially and takes a sum every N codes. That is, despreading is performed as follows.

$e_1 = s_1 z'[1] + s_2 z'[2] + \ldots + s_N z'[N],$ $e_2 = s_{N+1} z'[1] + s_{N+2} z'[2] + \ldots + s_{2N} z'[N],$ $e_3 = s_{2N+1} z'[1] + s_{2N+2} z'[2] + \ldots + s_{3N} z'[N], \ldots$ The sequences acquired in this manner are the restored information data.

In this scheme, data N times the original information data $b_1, b_2, b_3, \ldots$ are transmitted from the transmitting apparatus 401. In the receiving apparatus 601, the number of recovered information data $e_1, e_2, e_3, \ldots$ becomes 1/N of the number of received data. Given that the chip length of signals to be transmitted and received is w, therefore, the chip length of the original information data and restored information becomes Nw.

Although the above computation is equivalent to the inner product, as spreading codes are orthogonal to one another, acquiring the inner product can make the amplitude of the transmission signals of other users zero. It is therefore possible to acquire only required signals.

Embodiment of Correlation Detection

In case where direct sequence spectrum spreading is executed by selecting one of a plurality of pseudorandom sequences in the transmitting apparatus 401, the receiving apparatus 601 can acquire the selected pseudorandom sequence through correlation detection. Further, the correlation detection can ensure synchronization for direct sequence spectrum spreading.

Figure 20:
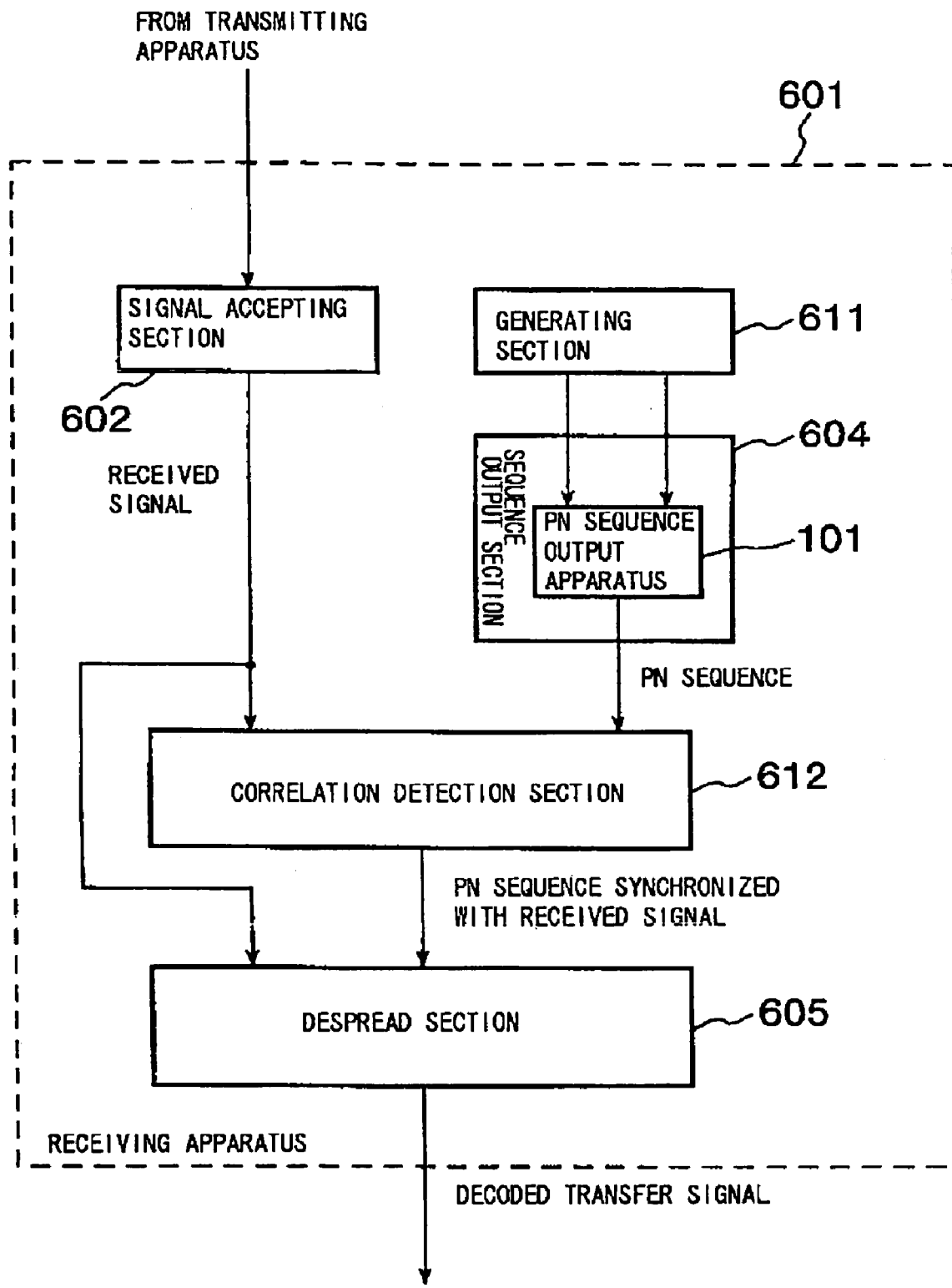
FIG. 20 is an exemplary diagram showing an embodiment of the receiving apparatus in case of executing correlation detection.

An embodiment of the receiving apparatus in case of executing correlation detection will be discussed below referring to FIG. 20. In FIG. 20, same reference symbols are given to the same elements as those shown in the aforementioned drawings.

The receiving apparatus 601 has the generating section 611 and a correlation detection section 612 in addition to the sequence accepting section 602, the sequence output section 604 and the despreading section 605.

The generating section 611 outputs sets of sequence initial values and integer parameters (orders) selectable by the transmitting apparatus 401. Only one pseudorandom sequence may be output. In this case, as it is not necessary to select any single set from the sets of sequence initial values and integer parameters (orders), the correlation detection section 612 serves to provide synchronization of signals.

The sequence output section 604 outputs pseudorandom sequences, which can be selected by the transmitting apparatus 401, in accordance with the sequence initial value and integer parameter (order) generated by the generating section 611.

The correlation detection section 612 attempts correlation detection for each of the pseudorandom sequences output from the sequence output section 604. The correlation detection is carried out by sequentially multiplying the received signal by the "elements" of the pseudorandom sequence to be checked. A known scheme can be used for the correlation detection scheme.

As the pseudorandom sequences to be used in this embodiment are excellent in correlation characteristic, the strength of signals after multiplication becomes extremely weak in case where different pseudorandom sequences are selected in the receiving apparatus 601, so that correlation detection would fail.

In case where correlation detection is executed with the same pseudorandom sequence of the transmitting apparatus 401 selected, on the other hand, the strength of signals after multiplication exceeds a predetermined value. Further, signal synchronization can be taken by shifting an offset of the pseudorandom sequence in such a way as to be synchronized with the received signal.

The despreading section 605 decodes the transfer signal by sequentially multiplying the signal, received by the sequence accepting section 602, by the "reciprocals of the elements" of the pseudorandom sequence which has been selected by the correlation detection section 612 and synchronized with the received signal.

The correlation detection section 612 sequentially multiplies the received signal by the "elements" of the pseudorandom sequence, whereas the despreading section 605 sequentially multiplies the received signal by the "reciprocals of the elements" of the pseudorandom sequence. The former computes autocorrelation and cross-correlation, whereas the latter performs decoding.

(Communication System)

The communication system according to the embodiment can be comprised of the transmitting apparatus 401 and the receiving apparatus 601 that receives a signal transmitted by the transmitting apparatus and decodes the transfer signal. If the pseudorandom sequence to be used differs between the transmitting apparatus 401 and receiving apparatus 601, decoding of the transfer signal would fail.

Even if a plurality of transmitting apparatuses 401 are communicating with a plurality of receiving apparatuses 601 over the same frequency band, it is possible to keep security and ensure mutual communications while guaranteeing the quality according to the number of pairs of communicators who are using them.

Because the pseudorandom sequences to be generated in this embodiment can significantly increase the types of codes as compared with the conventional pseudorandom sequences, particularly, they are suitable for CDMA type communications which potentially include many users.

(Receiving Apparatus Which Receives Asynchronously Transmitted Signals)

Figure 21:
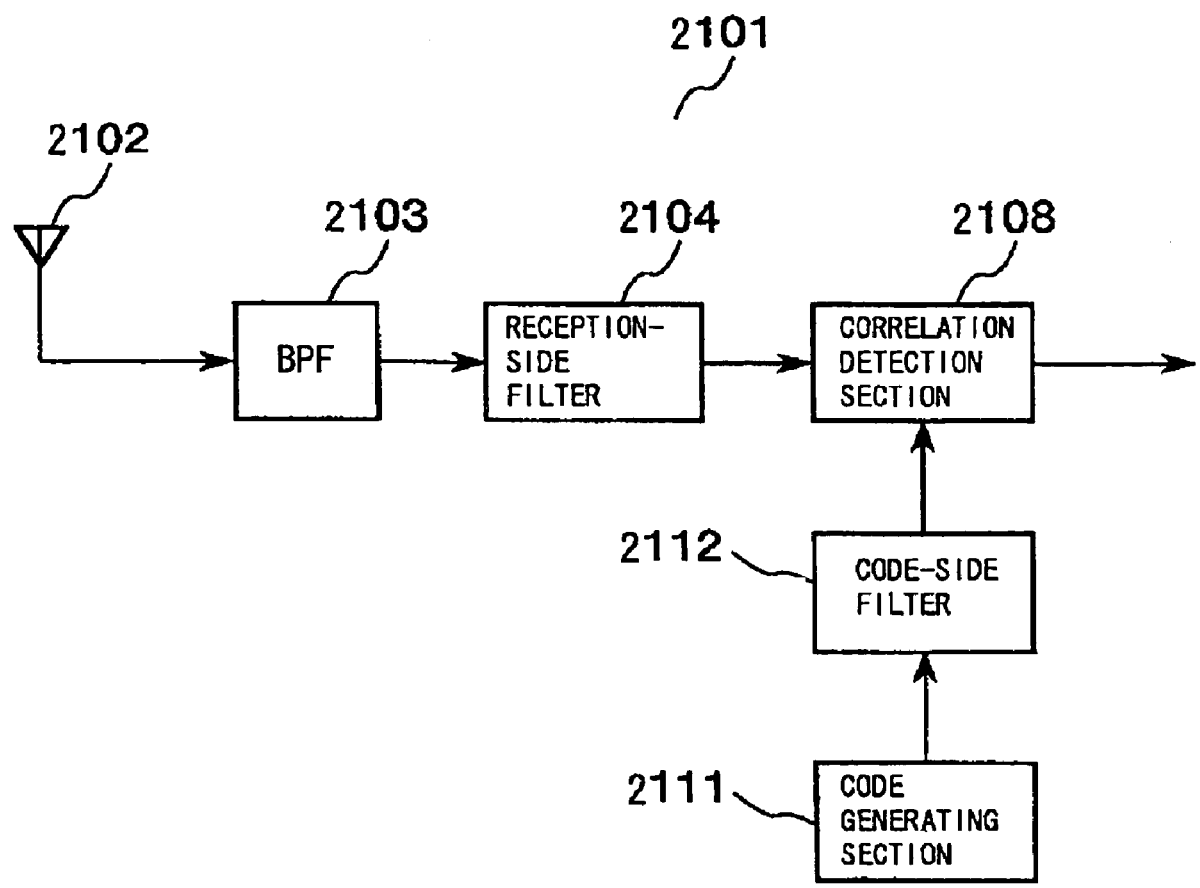
FIG. 21 is an exemplary diagram showing an embodiment of the receiving apparatus which receives signals transmitted asynchronously.

As signals are transmitted asynchronously from a mobile terminal to a base station in mobile communication, communication between both is initiated. The following will discuss an embodiment where the invention is adapted to the receiving apparatus of such a base station. FIG. 21 is an exemplary diagram showing the schematic structure of the receiving apparatus of the embodiment.

A receiving apparatus 2101 receives a signal via an antenna 2102. The received signal is subjected to a process of converting an RF frequency band to a base band frequency band by a band-pass filter (BPF) 2103 and is then sent to a reception-side filter 2104.

Meanwhile, a code generating section 2111 generates codes included in an orthogonal code sequence. The orthogonal code sequences include the following, for example.

M-sequence
Gold-codes
orthogonal code sequence acquired from a Walsh function (Walsh-Hadamard sequence)
orthogonal code sequence acquired from a Chebyshev's polynomial
Baker sequence
Manchester-coded orthogonal sequence Further, in the CDMA communication technology, signal processing for spreading/despreading is executed using complex spreading codes. In this case, therefore, a complex number whose real portion and imaginary portion are assigned with codes included in those orthogonal code sequences is generated as a code.

The generated code is sent to a code-side filter section 2112.

While the FIR (Finit Impulse Response) filters 201 shown in the aforementioned FIG. 3 which have the same parameters D, x, r, N are used for the reception-side filter 2104 and the code-side filter section 2112, it is desirable to set $r = 2 - 3^{1/2}$.

The correlation of the signal that has been processed by the reception-side filter 2104 and the code-side filter section 2112 is detected by the correlation detection section 2108. The correlation between complex numbers is acquired by conjugating either one of the complex numbers and calculating the product of it and the other complex number.

Then, a transfer signal is acquired by adequately performing despreading or the like of the result of the correlation detection with the spreading codes of the mobile station and despreading codes of the base station taken as the same.

As signals are transmitted asynchronously from a mobile terminal to a base station in mobile communication, communication between them is started. Therefore, this correlation detection becomes extremely important in reduction of the BER. In case of communication from the base station to a mobile station (Down Link Communication), on the other hand, synchronization has been taken beforehand so that this technique is not essential.

The embodiment has such a feature that while the embodiment, if used on the base station side (reception side) alone, is sufficient to improve the BER, mobile terminals which have already been prevailing and used can be kept utilized.

Figure 22:
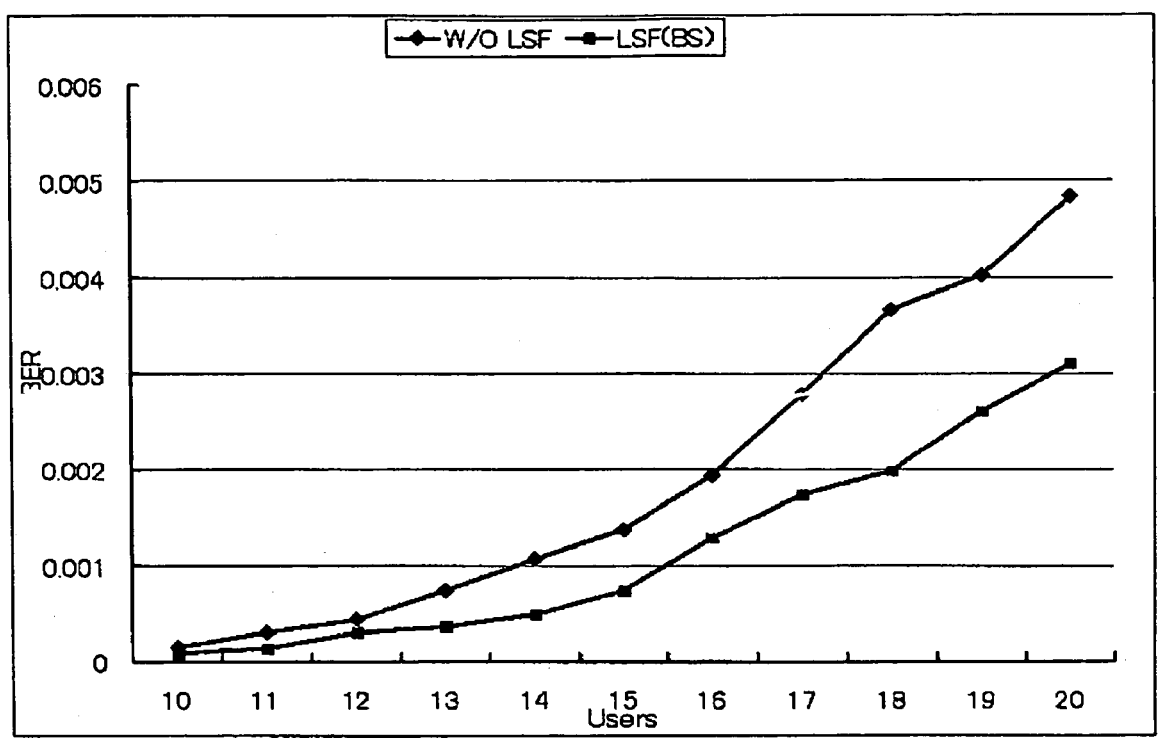
FIG. 22 is a graph of simulation results showing the relationship between the number of users and the BER in a W-CDMA system in case where the present technique is adapted and the conventional W-CDMA system.

FIG. 22 is a graph of simulation results showing the relationship between the number of users and the BER in a W-CDMA system in case where the present technique is adapted and the conventional W-CDMA system. The following description will be given referring to this diagram.

In FIG. 22, the horizontal axis is the number of users and the vertical axis is the BER, showing the results in the case where this technique is adapted (LSF(BS) in the diagram) and the case of the prior art (W/O LSF in the diagram).

In case where the number of users is 20, for example, the BER is about 0.005 in the prior art whereas the BER is about 0.003 according to the present technique, showing a considerable improvement on the BER. With the same BER, merely performing the filter process of this technique on the base station side can increase the number of users by about 10 to 20 percent as compared with the prior art.

In particular, as the facility cost of the base station for W-CDMA which has the same user capacity can be reduced by about 10 to 20 percent by merely using the simple FIR filter of the invention, this embodiment is considerably effective at the time of promoting the W-CDMA system.

(Complex Filter)

Figure 23:
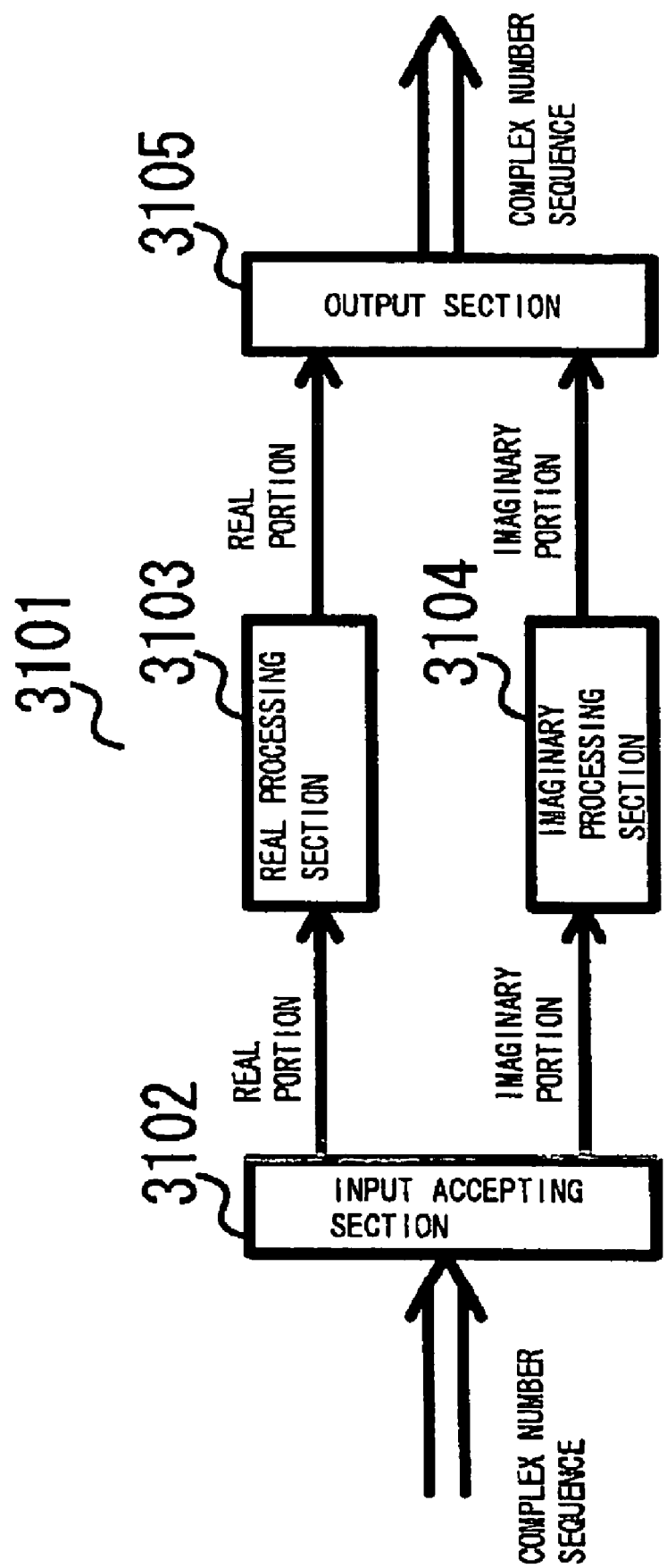
FIG. 23 is an exemplary diagram showing the schematic structure of an embodiment of a complex filter of the invention.

FIG. 23 is an exemplary diagram showing a preferable embodiment of a complex filter, particularly, the schematic structure of a complex filter suitable for a mobile telephone or the like of the W-CDMA standard.

A filter apparatus 3101 according to this embodiment performs a filter process on complex number sequences using a predetermined impulse constant r and a predetermined delay time constant D, and has an input accepting section 3102, a real processing section 3103, an imaginary processing section 3104 and an output section 3105.

First, the input accepting section 3102 accepts inputting of a complex number sequence.

Next, the real processing section 3103 accepts, as an input, a real portion sequence in the complex number sequence whose input has been accepted by the input accepting section 3102, and outputs a filtered sequence.

Meanwhile, the imaginary processing section 3104 accepts, as an input, an imaginary portion sequence in the complex number sequence whose input has been accepted by the input accepting section 3102, and outputs a filtered sequence.

The processes that are performed in the real processing section 3103 and the imaginary processing section 3104 can be executed in parallel.

And, the output section 3105 outputs a complex number sequence whose real portion is the sequence output from the real processing section 3103 and whose imaginary portion is the sequence output from the imaginary processing section 3104.

Here, the real processing section 3103 and the imaginary processing section 3104 output a plurality of sequences having input sequences delayed, amplify the plural sequences, and output the sums of the amplified sequences, the delay times of the plural sequences form an arithmetical progression of a common difference D, and amplification factors respectively corresponding to them form a geometrical progression of a common ratio $-r$ or common ratio $-1/r$.

Here, the real processing section 103 and the imaginary processing section 104 are the FIR (Finite Impulse Response) filters 201 shown in FIG. 3 and use the same parameters D, r, x, N. The real portion and imaginary portion of a complex number sequence are filtered by using those two FIR filters 201 respectively.

(Spread-Modulation Apparatus)

Figure 24:
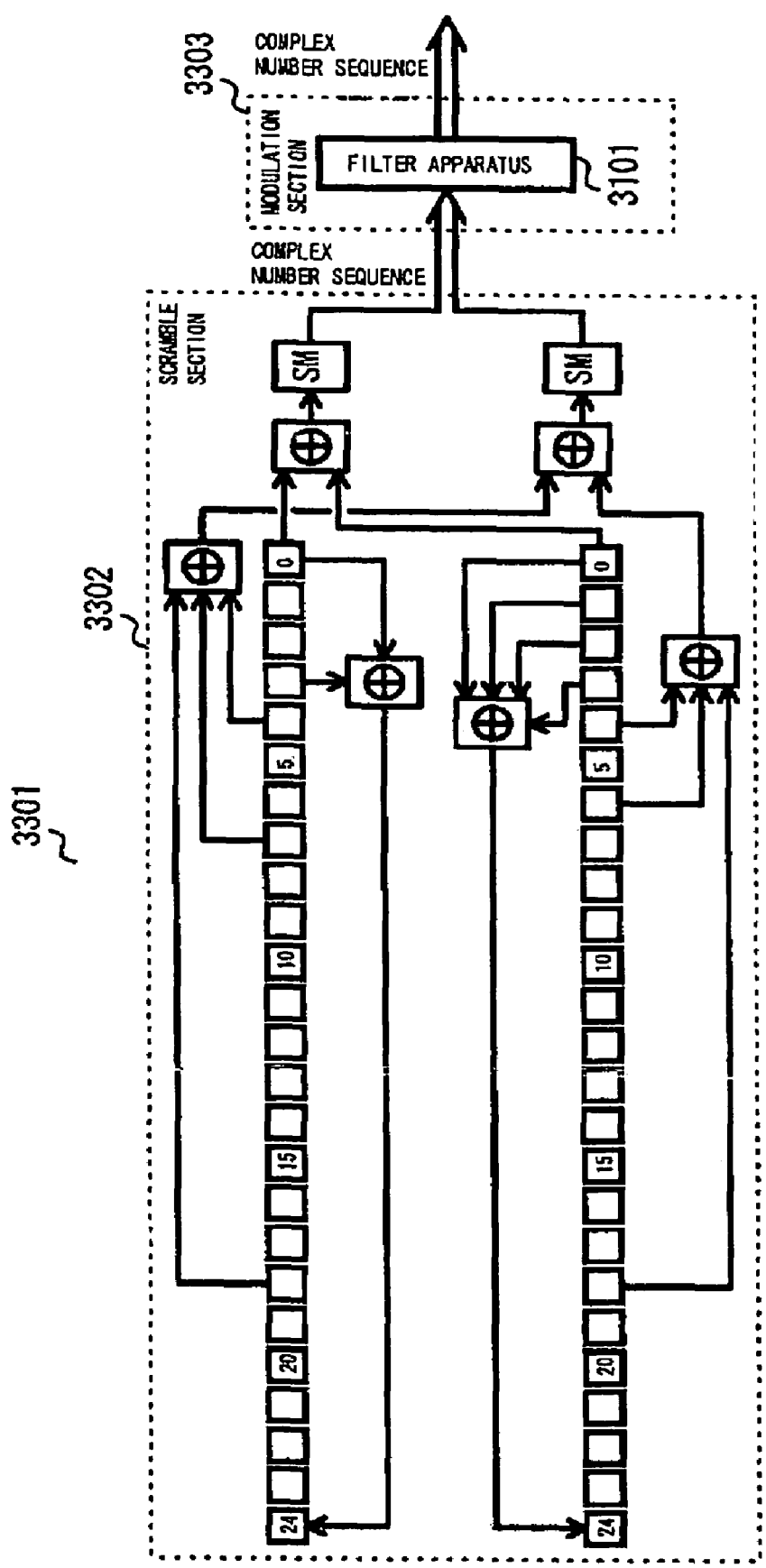
FIG. 24 is an exemplary diagram showing the schematic structure of a spread-modulation apparatus which performs a despread-modulation process for W-CDMA using the complex filter apparatus.

FIG. 24 is an exemplary diagram showing the schematic structure of a spread-modulation apparatus which performs a despread-modulation process for W-CDMA using the complex filter apparatus 3101.

A spread modulation apparatus 3301 has a scramble section 3302 and a modulation section 3303.

The scramble section 3302 outputs a complex number resulting from scrambling the real portion and imaginary portion of an input digital complex number with a predetermined spreading code of a chip rate 1/D.

Because the embodiment is for W-CDMA, scrambling which conforms to the IMT-2000 W-CDMA system standard is adapted, but in case of using another wireless communications system (CDMA 2000 system standard, Wireless LAN IEEE 802.11b standard or the like), scrambling which conforms to that system should be executed.

FIG. 23 shows an example in which such a real portion and imaginary portion are scrambled together. In the embodiment in FIG. 23, scrambling is performed using a Gold-code with a length of $2^{25}-1$ as a scrambling code. This Gold-code is generated by obtaining an exclusive logical sum for each bit of two types of M-sequences generated from a generation polynomial of the 25-th degree over finite fields GF(2).

As disclosed in H. Holma and A. Toskala, "W-CDMA for UTMS" (John Wiley and Son, 2001) or 3rd Generation Partnership Project (3GPP); Technical Specification Group Radio Access Network; Spreading and Module (FDD) (3GTS 25.213), a scrambling code is generated at 3.84 M chips/sec according to the W-CDMA standard.

Information of scrambled plural bits is converted to 'bit sequence' or "sequences of 'bit sequence'" by a sine mapper (SM) and they are given to the filter apparatus 3101 in the modulation section 3303 as an input of a complex number sequence. The output of the filter apparatus 3101 in the modulation section 3303 becomes the output of the spread modulation apparatus 3301.

For the spreading code, the scramble section can be constructed so as to scramble any one of a Gold-code, a Baker sequence and a Walsh-Hadamard orthogonal code as a spreading code.

In addition, the spreading code or the spreading code of the scramble section may be given at individual points on the orbit of a map dynamical system having ergodicity. As the map dynamical system having ergodicity, there is a map of a Chebyshev's polynomial $F_a(\cdot)$ of the a-th order equal to or higher than the second order.

Meanwhile, the modulation section 3303 gives the complex number output from the scramble section 3302 to the filter apparatus 3101 as an input and spread-modulates it. As mentioned above, the chip length of an input digital signal and the parameter of the delay time of the FIR filter 201 used by the modulation section 3303 are both equal to a predetermined delay time D.

(Experimental Results)

The following will describe the results of experiments conducted on the characteristics of the filter apparatus 3101 used in the embodiment and the characteristics of transferred signals.

Figure 25:
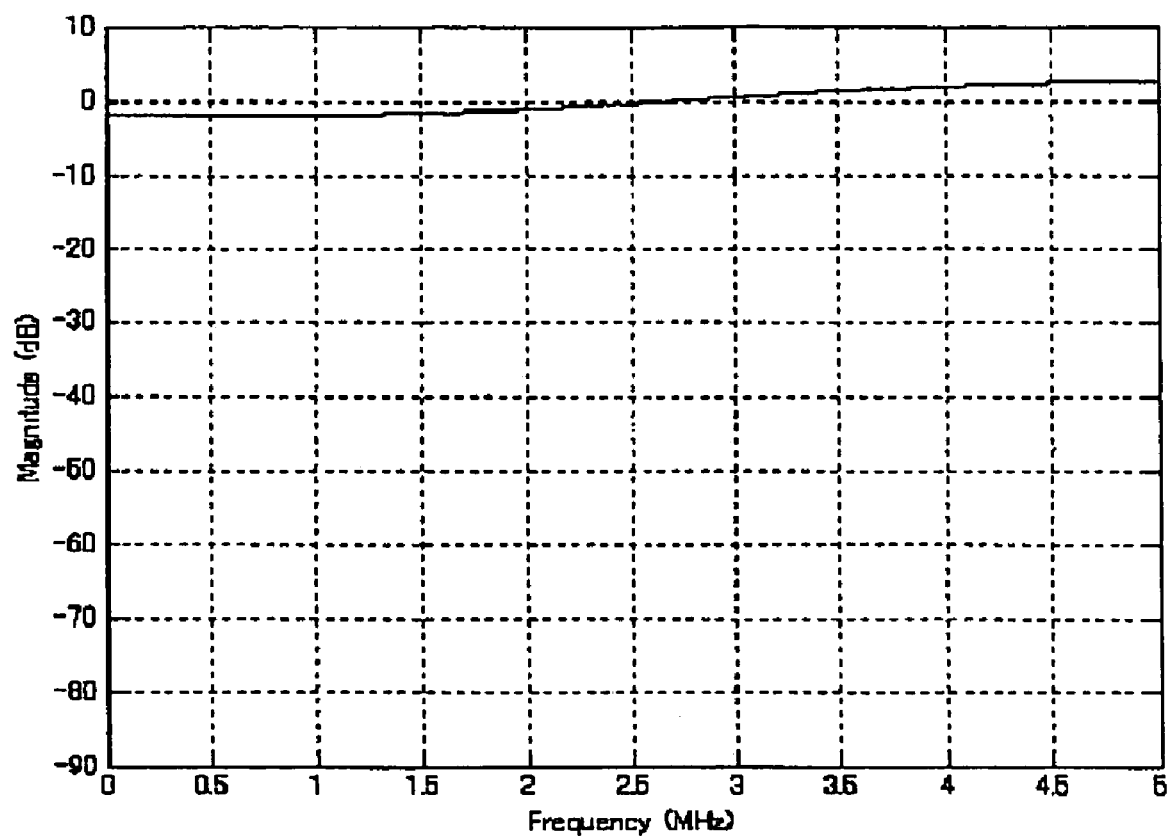
FIG. 25 is a graph showing the frequency characteristic of the complex filter apparatus.
Figure 26:
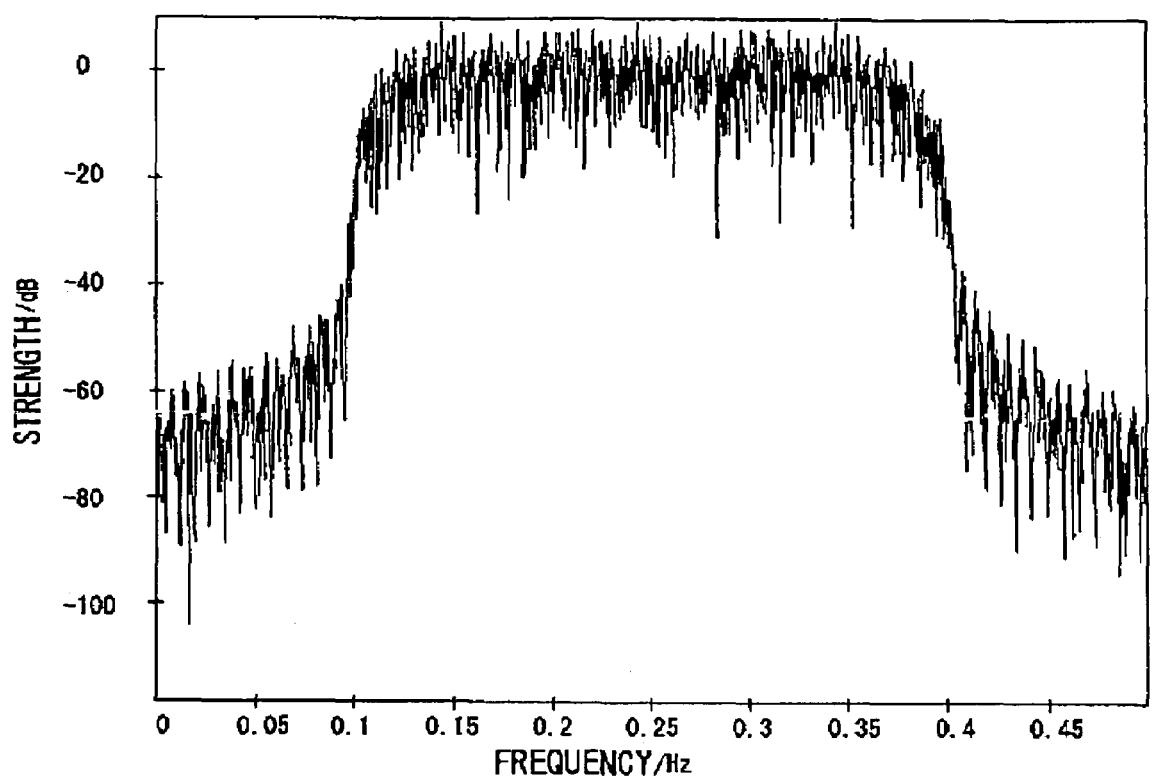
FIG. 26 is a graph showing the spectrum distribution of signals transmitted by the spread modulation apparatus.

FIG. 25 is a graph showing the frequency characteristic of the filter apparatus 3101 (the horizontal axis is a frequency of 0 MHz to 5 MHz and the vertical axis is the magnitude of $-90$ db to 10 db). FIG. 26 is a graph showing the spectrum distribution of signals transmitted by the spread modulation apparatus 301 (the horizontal axis is a frequency of 0 MHz to 0.5 MHz and the vertical axis is the magnitude of −120 db to 10 db).

As shown in FIG. 25, the frequency spectrum of the filter apparatus 3101 has a magnitude of −2 db to 2 db with respect to the frequency of 0 MHz to 5 MHz. As shown in FIG. 26, the magnitude of the frequency spectrum after has a shape of the foot of a mountain and is low with respect to the frequencies of 0 to 0.1 MHz and 0.4 to 0.5 Hz, but shows a spectrum shape with a flat magnitude in a range of 0.15 Hz to 0.35 Hz.

From those it is apparent that the frequency characteristic of the filter apparatus 3101 is the same as a filter which passes all the frequency bands (all pass filter) and the filter apparatus 3101 does not influence the spectrum distribution of a signal to be transferred.

With the transfer rate of 60 kbps, 15 users and the WWGN channel $E_0/N_0$ being 10 db, the W-CDMA system was constructed and simulation tests were conducted. Then, the bit error rate was 0.0012 according to the prior art scheme, whereas it was 0.00075 according to the embodiment. Therefore, the bit error rate is reduced by about 60 percent, which shows the effectiveness of this embodiment.

In case where the embodiment is adapted to wireless communication, therefore, even if a plurality of transmitting apparatuses are communicating with a plurality of receiving apparatuses over the same frequency band, it is possible to keep security and ensure mutual communications while guaranteeing the quality according to the number of communicators who are using them.

INDUSTRIAL APPLICABILITY

As described above, the present invention can provide a filter apparatus, a receiving apparatus, a transmitting apparatus, a pseudorandom sequence output apparatus, a filter method, a receiving method and a transmitting method, a pseudorandom sequence output method, which are suitable in various usages, and a program which realizes them on a computer.

The invention is based on Japanese Patent Application No. 2001-087480 filed on Mar. 26, 2001, Japanese Patent Application No. 2001-306794 filed on Oct. 2, 2001 and Japanese Patent Application No. 2002-045255 filed on Feb. 21, 2002, and includes the specifications, claims, drawings and abstracts of those applications. The present specification incorporates what is disclosed in the applications entirely by reference.

The invention claimed is:

1. A receiving apparatus which obtains a signal from a transmitter, wherein said transmitter spreads the signal with a spreading code and transmits the spread signal to said receiving apparatus, said receiving apparatus comprising:

a signal receiving section which receives the spread signal;
a reception-side filter section which accepts said received spread signal as an input sequence and filters the received spread signal;
a code generating section which generates a spreading code that is same as that used in the spreading by said transmitter;
a code-side filter section which accepts said generated spread code as an input sequence and filters the geneerated spread signal; and
a correlation detection section which performs correlation detection on a result of filtering in said reception-side filter section with respect to a result of filtering in said code-side filter section and obtains the signal from said transmitter,
wherein each of said reception-side filter section and said code-side filter section is a filter apparatus with respect to a predetermined real impulse constant r (−1<r<1), a predetermined non-zero real number constant x, a predetermined delay time constant D (D>0) and a predetermined positive integer M, comprising:
an input terminal which accepts an input signal;
a delay amplification section which outputs M signals that are said acceted input signal delay amplified with a delay time $t_0$ and an amplification factor $a_0$, with a delay time $t_1$ and an amplification factor $a_1$, . . . , and with a delay time $t_{M-1}$ and an amplification factor $a_{M-1}$, respectively;
an adding section which outputs a sum of M output signals; and
an output terminal which outputs the added M output signals; and
wherein,
$t_0$ is greater than 0,
$t_0, t_1, \ldots, t_{M-1}$ is an arithmetical progression of a common difference D, and
$a_0, a_1, \ldots, a_{M-1}$ is a geometrical progression of a common ratio −r or −1/r.

2. The receiving apparatus as recited in claim 1, wherein said code generating section generates, as spreading codes,
an orthogonal code sequence (one of an M-sequence, Gold-codes, an orthogonal code sequence acquired from a Walsh function, and an orthogonal code sequence acquired from a Chebyshev's polynomial, or a Baker sequence or a Manchester-coded orthogonal sequence), or
a complex orthogonal code sequence in which a real portion and an imaginary portion are respectively composed of different orthogonal code sequences, and
wherein the predetermined real impulse constant r is more than $2-3^{1/2}-0.1$ and less than $2-3^{1/2}+0.1$.

3. A receiving method which obtains a signal from a transmitter, wherein said transmitter spreads the signal with a spreading code and transmits the spread signal to said receiving apparatus, said receiving method comprising:

a signal receiving step which receives the spread signal;
a reception-side filter step which accepts said received spread signal as an input sequence and filters the received spread signal;
a code generating step which generates a spreading code that is same as that used in the spreading by said transmitter;
a code-side filter step which accepts said generated spread code as an input sequence and filters the generated spread signal; and
a correlation detection step which performs correlation detection on a result of filtering in said reception-side filter step with respect to a result of filtering in said code-side filter step, and wherein,
each of said reception-side filter step and said code-side filter step performs a filtering process by a filter method with respect to a predetermined real impulse constant r (−1<r<1), a predetermined non-zero real number constant x, a predetermined delay time constant D (D>0) and a predetermined positive integer M, comprising:
an input step which accepts an input signal;
outputs M signals that are said accepted input signal delay amplified with a delay time $t_0$ and an amplification factor $a_0$, with a delay time $t_1$ and an amplification factor $a_1, \ldots$, and with a delay time $t_{M-1}$ and an amplification factor $a_{M-1}$, respectively;

an adding step which outputs a sum of M output signals and output M signals; and an output step which outputs the added M output signals; and wherein, $t_0$ is greater than 0, $t_0, t_1, \ldots, t_{M-1}$ is an arithmetical progression of a common difference D, and $a_0, a_1, \ldots, a_{M-1}$ is a geometrical progression of a common ratio $-r$ or $-1/r$.

4. The receiving method as recited in claim 3, wherein said code generating step generates, as spreading codes, an orthogonal code sequence (one of and M-sequence, Gold-codes, an orthogonal code sequence acquired from a Walsh function, and an orthogonal code sequence acquired from a Chebyshev's polynomial, or a Baker sequence or a Manchester-coded orthogonal sequence), or a complex orthogonal code sequence in which a real portion and an imaginary portion are respectively composed of different orthogonal code sequences and wherein the predetermined real impulse constant r is more than $2-3^{1/2}-0.1$ and less than $2-3^{1/2}+0.1$.

\* \* \* \* \*